United States Patent
Nitayama et al.

(10) Patent No.: US 6,236,079 B1
(45) Date of Patent: *May 22, 2001

(54) DYNAMIC SEMICONDUCTOR MEMORY DEVICE HAVING A TRENCH CAPACITOR

(75) Inventors: Akihiro Nitayama, Kawasaki; Katsuhiko Hieda, Yokohama, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/982,478

(22) Filed: Dec. 2, 1997

(51) Int. Cl.[7] .......................... H01L 27/108; H01L 29/76; H01L 29/94; H01L 31/119
(52) U.S. Cl. .......................... 257/306; 257/304; 257/311; 438/244; 438/248
(58) Field of Search .................................. 257/304, 306, 257/311; 438/243, 244, 248

(56) References Cited

U.S. PATENT DOCUMENTS

| | | | |
|---|---|---|---|
| 4,763,179 | 8/1988 | Tsubouchi et al. | 357/23.6 |
| 4,801,988 | 1/1989 | Kenney | 357/26.3 |
| 4,816,884 | 3/1989 | Hwang et al. | 357/23.6 |
| 4,830,978 | 5/1989 | Teng et al. | 437/52 |
| 4,830,981 | 5/1989 | Baglee et al. | 437/47 |
| 4,833,516 | 5/1989 | Hwang et al. | 357/23.6 |
| 4,853,348 | 8/1989 | Tsubouchi et al. | 437/203 |
| 4,942,554 | 7/1990 | Kircher et al. | 365/149 |
| 4,953,125 | 8/1990 | Okumura et al. | 365/149 |
| 4,988,637 | 1/1991 | Dhong et al. | 437/58 |
| 5,034,787 | 7/1991 | Dhong et al. | 357/23.6 |
| 5,065,273 | * 11/1991 | Rajeevakumar | 361/313 |
| 5,107,459 | 4/1992 | Chu et al. | 365/63 |
| 5,177,576 | 1/1993 | Kimura et al. | 257/71 |
| 5,216,266 | 6/1993 | Ozaki | 257/302 |

(List continued on next page.)

OTHER PUBLICATIONS

Nesbit, I., et al., "A0.6 mu–sq. 256 Mb Trench DRAM Cell with Self–Aligned BuriEd Strap (BEST)", IEDM–93, pp. 627–630 (26.2.1–4), Jan. 1993.*

Primary Examiner—Olik Chaudhuri
Assistant Examiner—Howard Weiss
(74) Attorney, Agent, or Firm—Banner & Witcoff, Ltd.

(57) ABSTRACT

A semiconductor memory device includes a semiconductor substrate and first, second, third and fourth spaced apart word lines formed on the semiconductor substrate and extending in a first direction. First, second, and third spaced apart bit lines are formed on the semiconductor substrate and extend in a second direction. An isolated active areas are formed on the semiconductor substrate under the second bit line. A first transfer gate transistor is formed in the active area, the first transfer gate transistor including spaced apart source and drain regions and the second word line being insulatively spaced from a channel region between the source and drain regions. A second transfer gate transistor is formed in the active area, the second transfer gate transistor including spaced apart source and drain regions and the third word line being insulatively spaced from a channel region between the source and drain regions. A first storage node is formed in a portion of the semiconductor substrate which is between the first and second word lines, between the first and second bit lines, under the second bit line, and between the second and third bit line. A second storage node is formed in a portion of the semiconductor substrate which is between the third and fourth word lines, between the first and second bit lines, under the second bit line, and between the second and third bit line.

9 Claims, 19 Drawing Sheets

U.S. PATENT DOCUMENTS

| | | | |
|---|---|---|---|
| 5,316,962 | 5/1994 | Matsuo et al. | 437/52 |
| 5,336,912 | 8/1994 | Ohtsuki | 257/304 |
| 5,372,966 | 12/1994 | Kohyama | 437/52 |
| 5,395,770 * | 3/1995 | Miki et al. | 117/94 |
| 5,462,767 | 10/1995 | Yamazaki et al. | 427/248.1 |
| 5,519,236 | 5/1996 | Ozaki | 257/302 |
| 5,521,115 * | 5/1996 | Park et al. | 438/243 |
| 5,563,085 | 10/1996 | Kohyama | 437/47 |
| 5,576,566 | 11/1996 | Kenney | 257/301 |
| 5,698,878 * | 12/1997 | Miyashita et al. | 257/301 |
| 5,843,820 * | 12/1998 | Lu | 438/243 |
| 5,930,107 * | 7/1999 | Rajeevakumar | 361/321.4 |

* cited by examiner

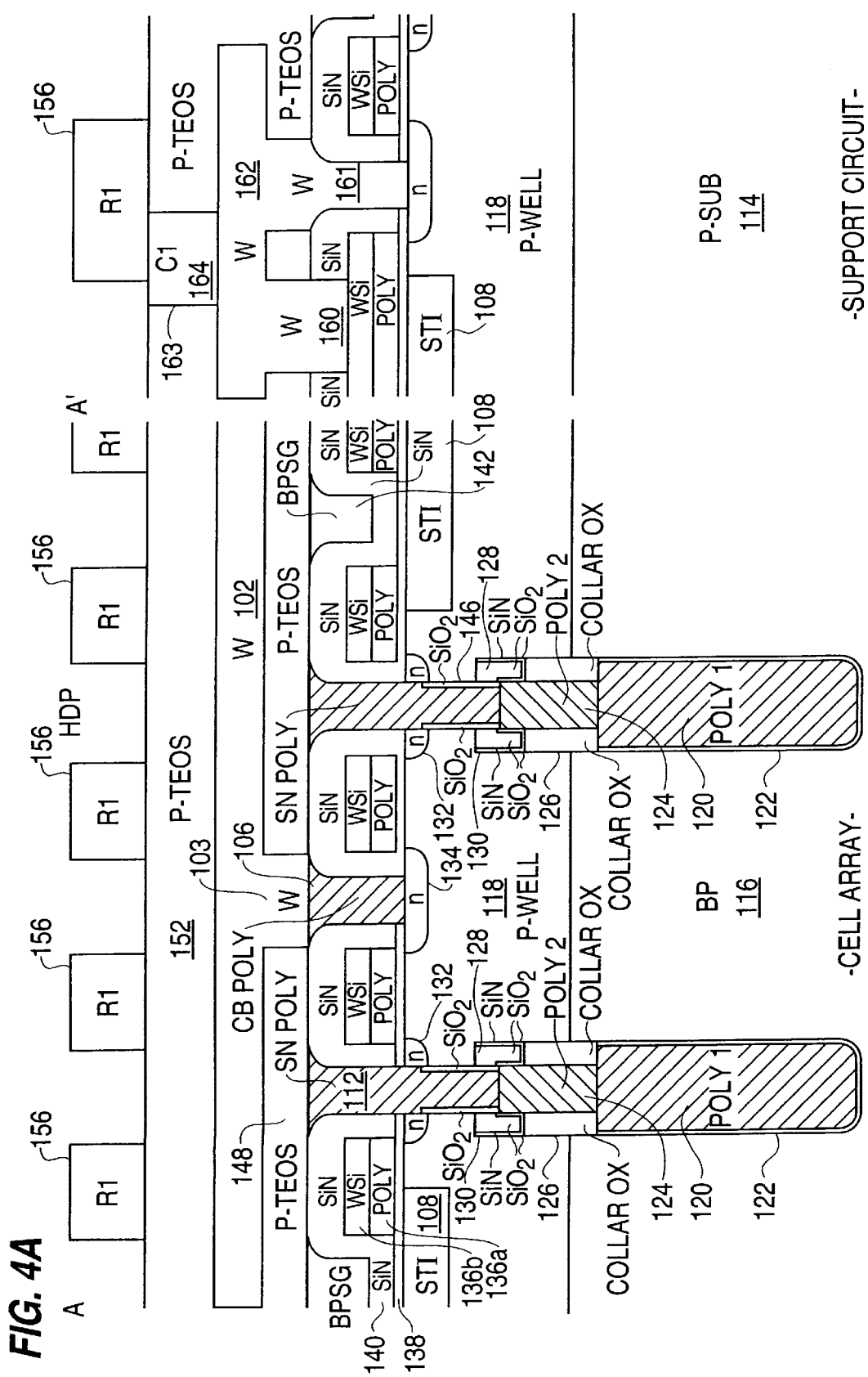

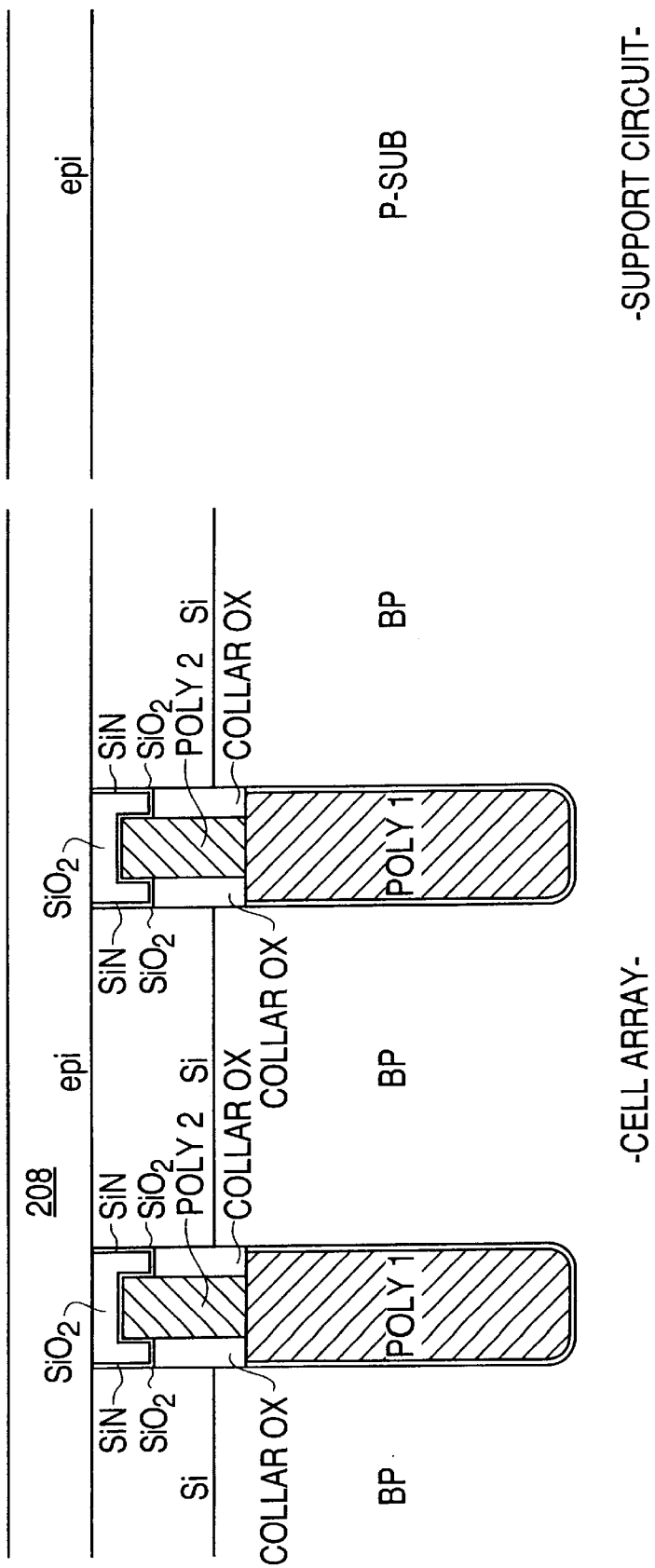

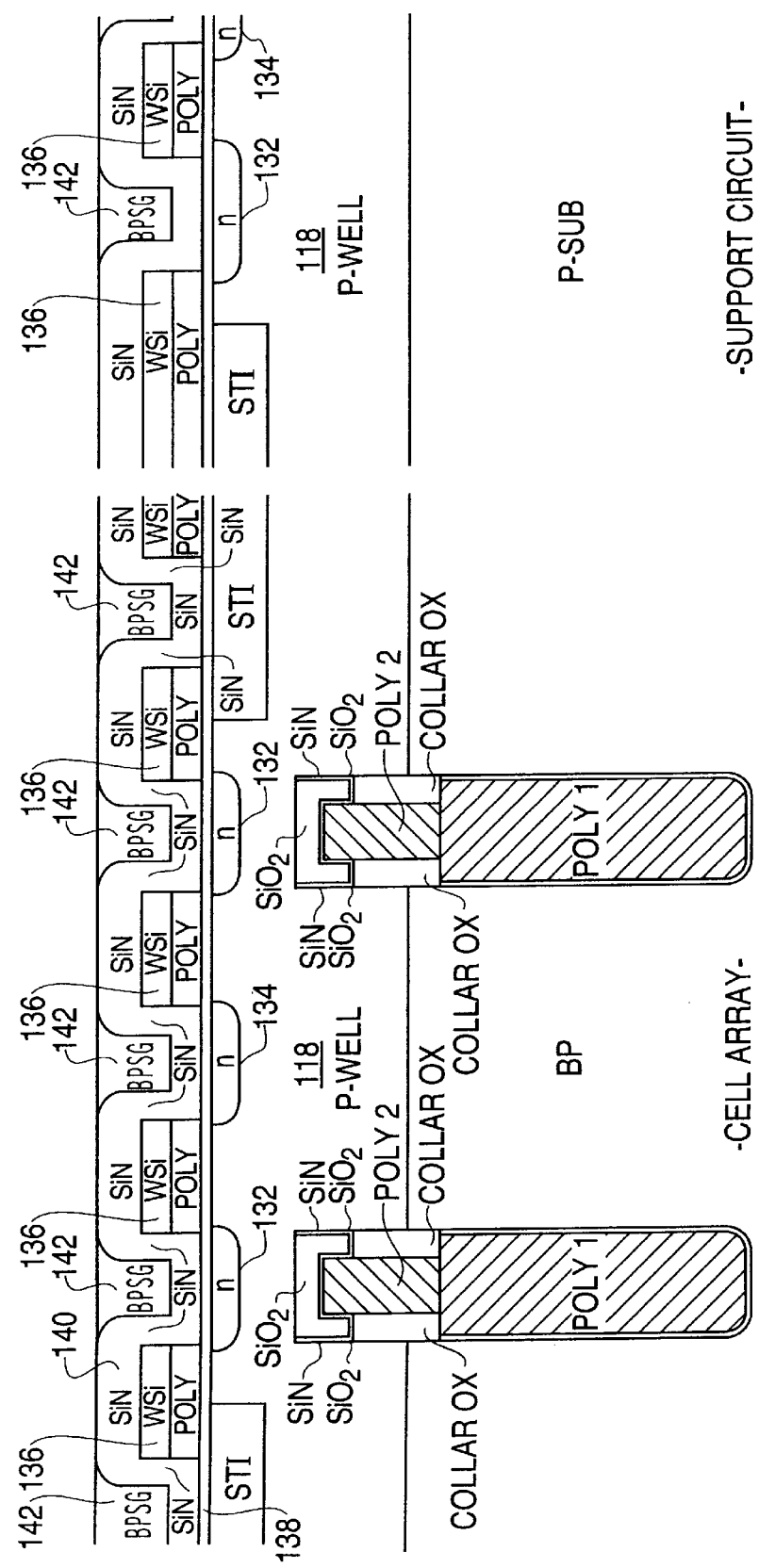

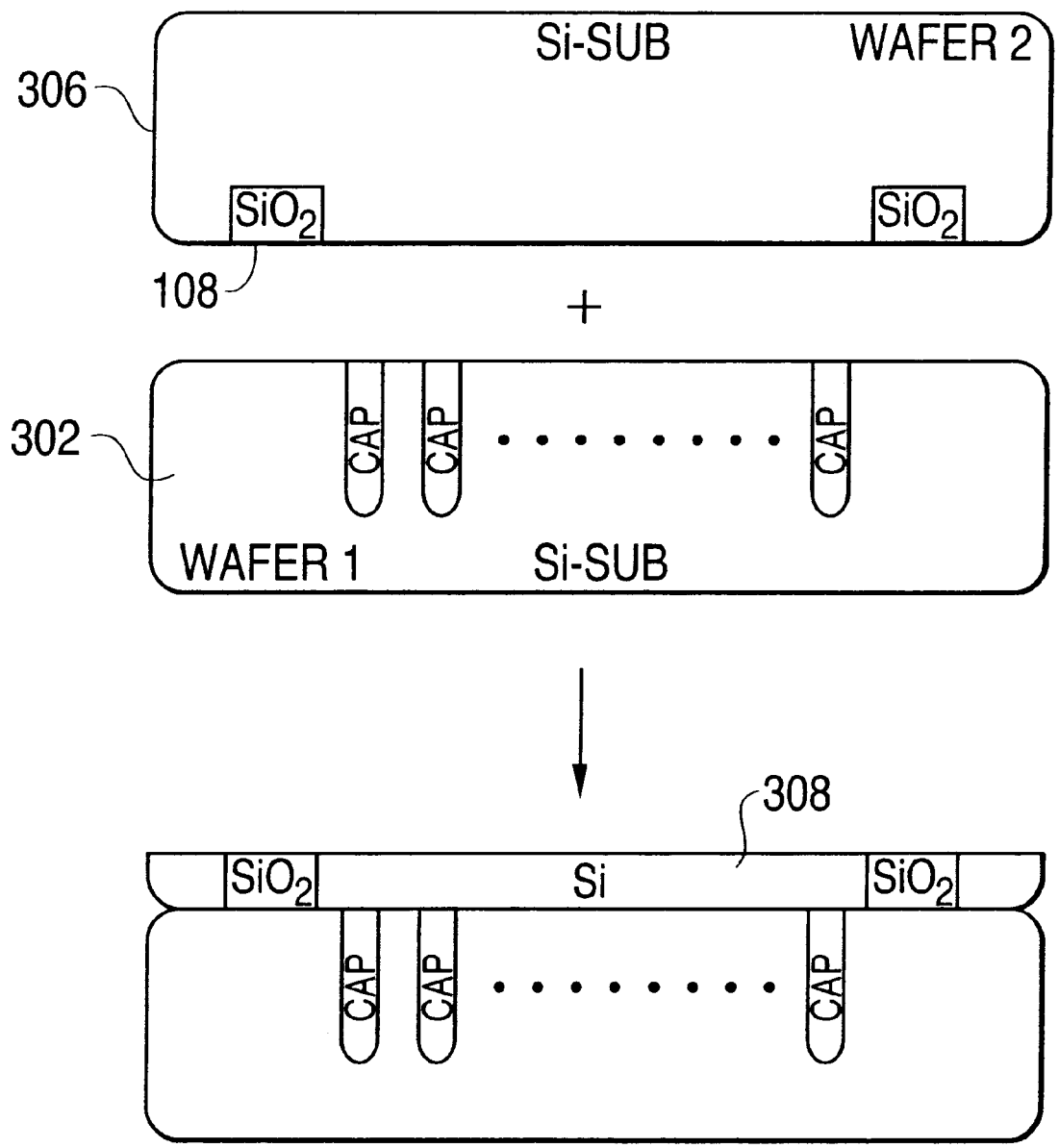

DYNAMIC SEMICONDUCTOR MEMORY DEVICE HAVING A TRENCH CAPACITOR

TECHNICAL FIELD

The present invention generally relates to semiconductor memory devices and methods of manufacturing the same and, more particularly, to highly integrated dynamic memory devices and methods of manufacturing the same.

DESCRIPTION OF THE RELATED ART

FIGS. 1A and 1B illustrate a memory cell having a MINT architecture and a 0.25 micron design rule which is usable in a 256 Mbit dynamic random access memory (DRAM) device. Specifically, FIG. 1A is a top-down view of the trench memory cell and FIG. 1B is a cross-sectional view taken along line A–A' of FIG. 1A. DRAM cell 50 includes a trench capacitor 55 and a MOS transfer gate 60. Trench capacitor 55 includes a first $N^+$-type polycrystalline silicon fill 65, a second polycrystalline silicon fill 67, and a collar oxide 71. Transfer gate 60 includes N-type source/drain and drain/source regions 73 and 74 formed in P-type well 75 and a WSix/polycrystalline silicon gate 77 insulatively spaced from the channel region between source/drain region 73 and drain/source region 74. A bit line contact 79 formed in an opening in an insulating layer 80 (of BPSG, for example) and in insulating layer 78 (of silicon nitride, for example) electrically connects source/drain region 73 to bit line 81. A shallow trench isolation (STI) structure 90 electrically isolates DRAM cell 50 from an adjacent DRAM cell and passing word line 92. Passing word line 92 has a WSix/polycrystalline silicon structure. A dielectric layer 87 is formed on bit line 81 and aluminum wirings 89 are formed on dielectric layer 87. One of the aluminum wirings 89 is connected to bit line 81 by a contact stud 91 of tungsten, for example. A diffusion region 83 electrically connects third polycrystalline silicon fill 69 and drain/source region 74 of MOS transfer gate 60. This diffusion region is formed by outdiffusing dopants from the highly doped poly-crystalline silicon fill in the storage trench into P-well 75. Diffusion region 83 and third poly-crystalline silicon fill 69 constitute a buried strap for connecting trench capacitor 55 to transfer gate 60.

While the memory cell structure of FIGS. 1A and 1B has been successfully applied to 256 Mbit DRAM devices, certain problems can adversely impact the manufacturing yield of such devices. With reference to FIG. 2A, the outdiffusion of dopants to form diffusion region 83 must be carefully controlled. If the dopants diffuse too far into the semiconductor substrate, the operation of transfer gate 50 can be adversely affected. This, for example, places certain limitations on the thermal processes used in the manufacturing process since long, high temperature processes will cause a greater outdiffusion of the dopants. In addition, various crystal defects can be generated at the intersection of the active area (transfer gate) and the deep trench. For example, various oxidation processes during the manufacturing process can cause expansion of the collar oxide 71. This expansion can lead to dislocations in the silicon. In addition to contributing to the adverse operation of the transfer gate, such dislocations can cause junction leakage from the buried strap diffusion layer 83. Still further, as shown in FIG. 2B, in some cases, there can be a discontinuity between the cell array junction and the buried strap caused by ion implantation shadowing due to a passing wordline.

Problems are also associated with the scaling-down of the DRAM cell of FIGS. 1A and 1B to form more highly integrated memory devices (e.g., 1 Gbit and 4 Gbit DRAM devices). In particular, the scaled-down memory cell must nonetheless provide a capacitor having a size (i.e., a capacitance) for storing a charge which is sufficient to ensure that data may be correctly written to and read out from the memory cell. Since scaling-down generally results in a shrinking of the horizontal dimensions of the memory cell, one possible way to provide a sufficiently-sized capacitor would be to increase the depth of the trench within which the capacitor is formed. In this way, the horizontal dimensions of capacitor may be scaled down while providing a capacitor of the same size or at least scaled down to a lesser degree. However, the high aspect ratios associated with such deep trenches create difficulties in the processes needed to fill the trenches. In short, to increase the size of trench capacitor 55 during scale-down, either the depth of the trench or the horizontal dimensions of the trench must be increased. Since increasing the depth suffers from processing problems as described above and since increasing the horizontal dimensions is contrary to scaling-down goal, it is difficult to increase the integration density of memory cells having the memory cell structure shown in FIGS. 1A and 1B for new generations memory devices.

One solution to this scaling-down problem is to overlap the transistor area and the deep trench area. Such a transistor over capacitor (TOC) arrangement is shown in U.S. Pat. No. 4,649,625 to Lu, which is incorporated herein by reference. In this structure, the transfer gate is formed on epitaxial silicon which has been laterally grown over an insulator formed on the deep trench. Such laterally grown epitaxial silicon often suffers from defects which can adversely affect the operating characteristics of the transistor and thus of the memory cell itself.

It would be desirable to provide semiconductor memory devices and methods of manufacturing the same which overcome these and other problems.

SUMMARY OF THE INVENTION

In accordance with a first aspect of the present invention, a semiconductor memory device includes a semiconductor substrate and first, second, third and fourth spaced apart word lines formed on the semiconductor substrate and extending in a first direction. First, second, and third spaced apart bits line are formed on the semiconductor substrate and extend in a second direction. An isolated active areas are formed on the semiconductor substrate under the second bit line. A first transfer gate transistor is formed in the active area, the first transfer gate transistor including spaced apart source and drain regions and the second word line being insulatively spaced from a channel region between the source and drain regions. A second transfer gate transistor is formed in the active area, the second transfer gate transistor including spaced apart source and drain regions and the third word line being insulatively spaced from a channel region between the source and drain regions. A first storage node is formed in a portion of the semiconductor substrate which is between the first and second word lines, between the first and second bit lines, under the second bit line, and between the second and third bit line. A second storage node is formed in a portion of the semiconductor substrate which is between the third and fourth word lines, between the first and second bit lines, under the second bit line, and between the second and third bit line.

In accordance with another aspect of the present invention, a semiconductor memory device includes a semiconductor substrate and first, second, third and fourth spaced apart word lines formed on the semiconductor substrate and extending in a first direction. A bit line is formed on the semiconductor substrate and extend in a second direction. An isolated active area is formed on the semiconductor substrate under the bit line. A first transfer gate transistor is formed in the active area, the first transfer gate transistor including spaced apart source and drain regions and the second word line being insulatively spaced from a channel region between the source and drain regions. A second transfer gate transistor is formed in the active area, the second transfer gate transistor including spaced apart source and drain region and the third word line being insulatively spaced from a channel region between the source and drain regions. A first storage node is formed in a portion of the semiconductor substrate which under the bit line, under the first and second word lines, and under the space between the first and second word lines. A second storage node is formed in a portion of the semiconductor substrate which is under the bit line, under the third and fourth word lines, and under the space between the third and fourth word lines.

In accordance with still another aspect of the present invention, a method is provided for forming memory cells each having a transfer transistor and a deep trench capacitor. The method includes forming trench capacitors in a semiconductor substrate and forming a conductive layer on the semiconductor substrate. The conductive layer is patterned to form a plurality of word lines and source and drain regions for the transfer gate transistors of the memory cells are formed. Contacts are formed for electrically connecting one of the source and drain regions of the transfer transistors of the memory cells to a corresponding one of the trench capacitors. The step of forming the contacts includes a step of etching the semiconductor substrate using the word lines as an etching mask, whereby openings formed by the etching are self-aligned to the word lines.

These and other features and advantages of the present invention will be better understood from a reading of the following detailed description in conjunction with the accompanying drawings.

BRIEF DESCRIPTION OF THE DRAWINGS

FIGS. 4A and 4B are cross-sectional views taken along lines 4A–4A' and 4B–4B' of FIG. 3, respectively.

FIGS. 5A–5J are cross-sectional views corresponding to FIG. 4A which illustrate a method of manufacturing the semiconductor memory device of FIGS. 3, 4A, and 4B.

FIG. 8 illustrates a wafer-bonding technique which may be used in the process of forming the semiconductor memory device of FIG. 6.

DETAILED DESCRIPTION

Figure 3:
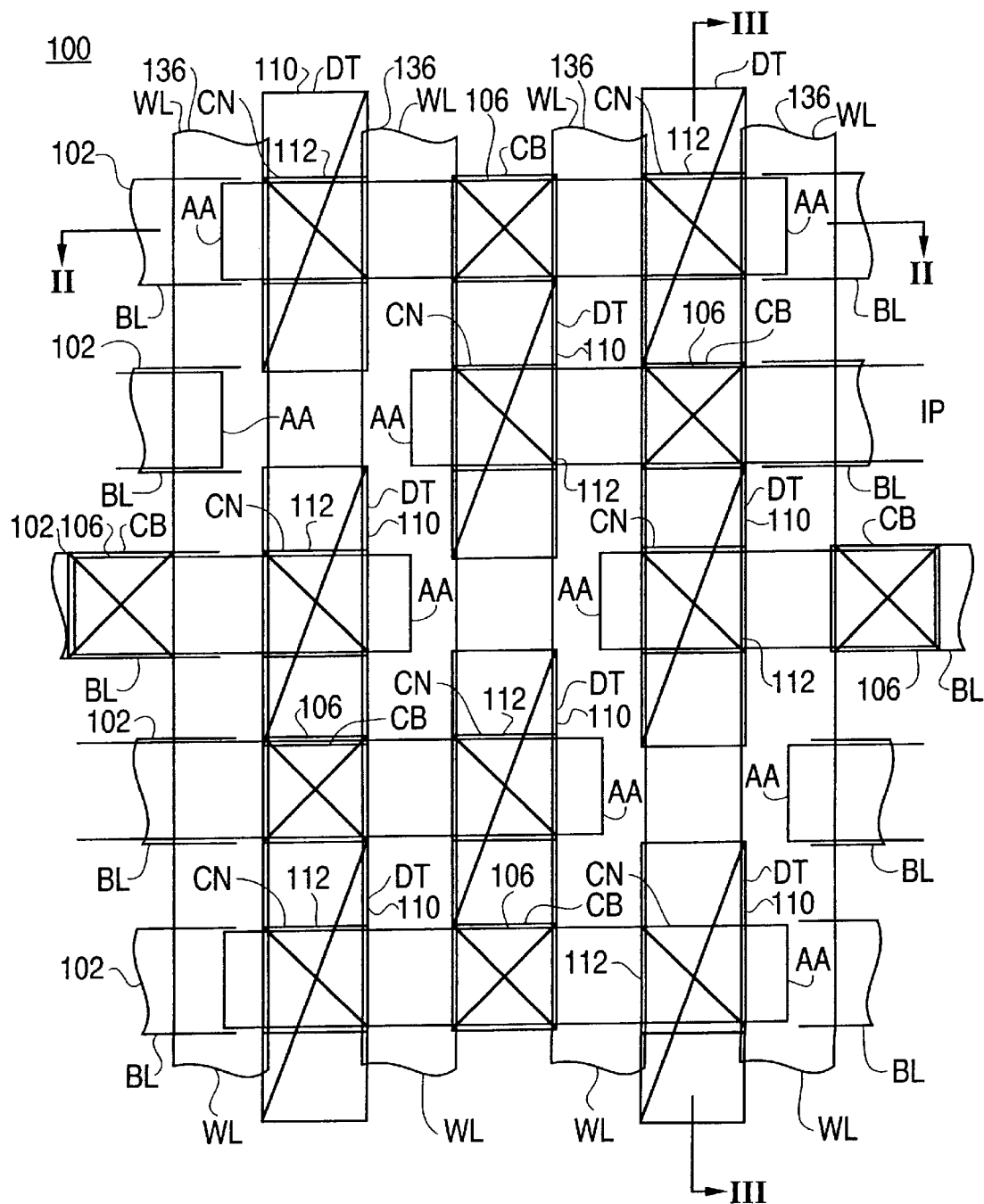
FIG. 3 is a top-down view of a semiconductor memory device in accordance with a first embodiment of the present invention.
Figure 4B:
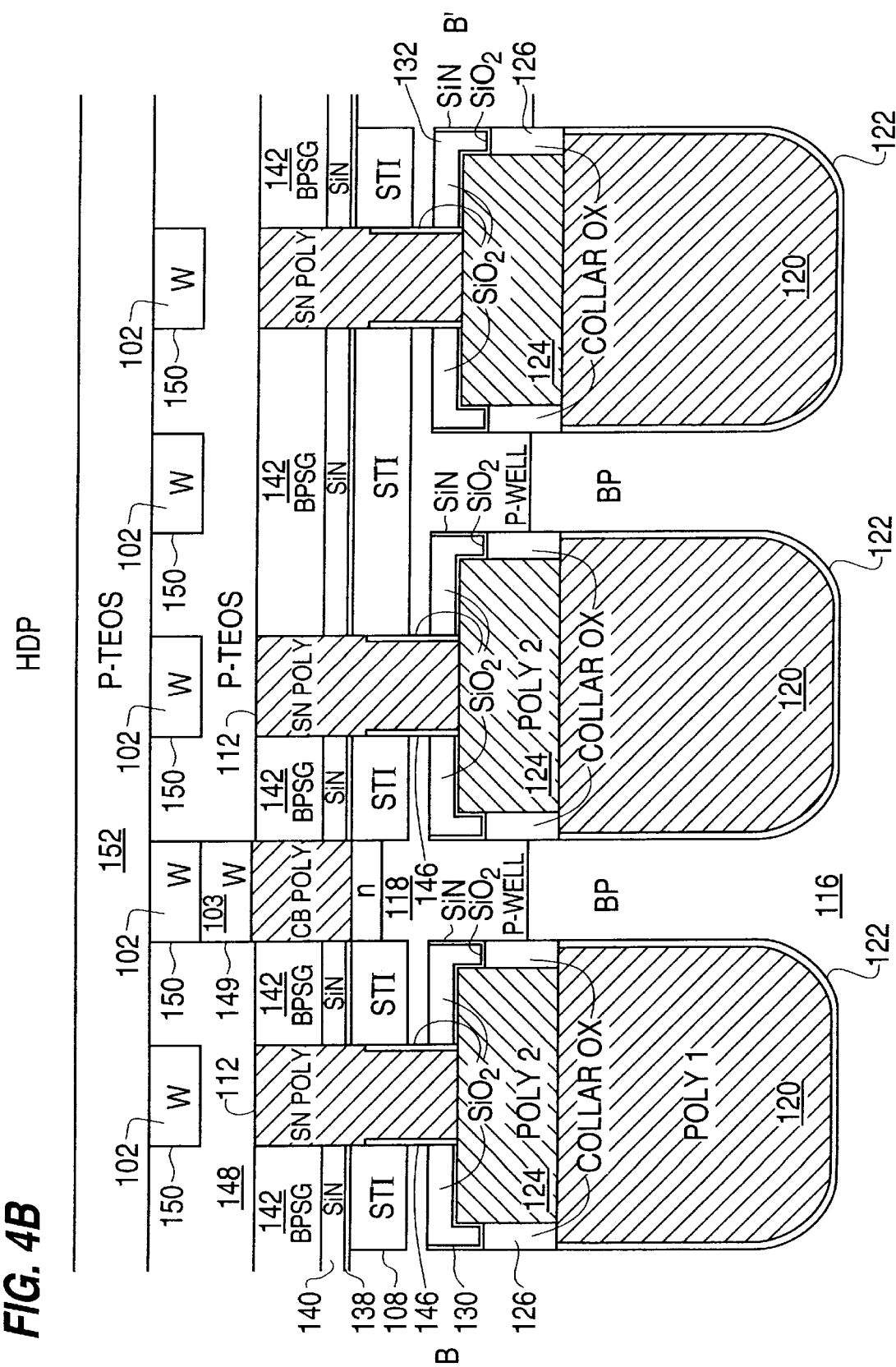

FIG. 3 is a top-down view of a semiconductor memory device 100 in accordance with a first embodiment of the present invention. FIG. 4A is a cross-sectional view taken along line 4A–4A' of FIG. 3 and FIG. 4B is a cross-sectional view taken along line 4B–4B' of FIG. 3. The cross-sectional view of FIG. 4A is extended to a support circuit region of the semiconductor memory device which is not shown in FIG. 3. Generally, circuits such as decoders, sense amplifiers, and the like are formed in the support circuit region. With reference to FIG. 3, memory device 100 includes bit lines 102 formed to extend in a first direction (i.e., horizontally in FIG. 3) and word lines 136 formed to extend in a second direction (i.e., vertically in FIG. 3). The portions of the word lines which extend over the channel regions of the transfer transistors constitute the gate electrodes of the transfer transistors. Bit line contacts 106 are arranged at a one-quarter pitch. That is, the bit line contacts for every fourth bit line are vertically aligned. A plurality of active areas AA are defined by shallow trench isolation (STI) structures 108 (see FIGS. 4(a) and 4(b)). Active areas AA have a width extending in the word line direction and a length extending in the bit-line direction. The trench capacitors (storage nodes) of the memory cells are formed in deep trenches 110. Deep trenches 110 have a width extending in the bit line direction and a length extending in the word line direction. Storage node contacts 112 are located between adjacent ones of the word lines and provide an electrical connection between the trench capacitors and the transfer gates.

As can be seen with reference to FIGS. 4A and 4B, an N-type diffusion region 116 and a P-type well region 118 are provided in the memory cell array region of a P-type silicon substrate 114. P-type well region 118 is also provided in the support circuit region of the silicon substrate 114. N-type diffusion region 116 has an impurity concentration (e.g., more than $1 \times 10^{17}$ cm$^{-3}$ at the peak) which is higher than the impurity concentration of the silicon substrate 114 and serves as a buried plate electrode for the memory cells of the memory device 100. P-type well region 118 has an impurity concentration of approximately $1 \times 10^{17}$ cm$^{-3}$ to $1 \times 10^{18}$ cm$^{-3}$. The trench capacitors include a first trench fill 120 which is insulated from the buried plate electrode 116 by a storage node insulating layer 122. Storage node insulating film 122 may, for example, be a nitride/oxide (NO) film including a layer of silicon nitride ($Si_3N_4$) and a layer of silicon dioxide ($SiO_2$). A second trench fill 124 is insulated from P-well 118 and buried plate electrode 116 by a collar oxide film 126. Collar oxide film 126 may, for example, be a silicon dioxide ($SiO_2$) film. A silicon dioxide ($SiO_2$) layer 128 is formed at the upper portion of deep trenches 110 and is spaced from P-well region 118, from collar oxide film 126, and from second trench fill 124 by a silicon dioxide ($SiO_2$)/ silicon nitride ($Si_3N_4$) liner layer 130. Each transfer gate includes spaced apart N-type source and drain regions 132 and 134. As shown in FIG. 4A, adjacent transfer transistors formed in a given active area have a common N-type drain region 134. Each transfer transistor further includes a gate electrode 136 which is insulatively spaced from a channel region between the N-type source and drain regions 132 and 134 by a gate insulating layer 138 of, for example, silicon dioxide ($SiO_2$). Gate electrode 136 is a polycide gate electrode including a polysilicon layer 136a and a silicide layer 136b (e.g., tungsten silicide) formed on the polysilicon layer, and a cap nitride layer (not shown) formed on silicide layer 136b. A conformal barrier layer 140 of, for example, silicon nitride (Si$_3$N$_4$), is formed on gate insulating layer 138 and the gate electrodes 136 and a BPSG layer 142 fills in the depressions in the barrier layer 140. Self-aligned storage node contacts (strap layers) 112 of polysilicon, for example, electrically connect the trench capacitors (via an opening formed in insulating layer 128 and liner layer 130) to the source regions 132 of the transfer transistors. As can be seen in FIG. 4A, storage node contacts 112 are formed between adjacent gate electrodes 136 and are insulated from P-well region 118 by an insulating layer 146. Bit line contacts 106 of, for example, polysilicon, are formed to contact the common drain region between adjacent transfer transistors. A first interlayer insulating film 148 of, for example, P-TEOS, is formed on the upper surfaces of barrier layer 140, BPSG layer 142, storage node contacts 112, and bit line contacts 106. Bit lines 102 and contacts 103 are formed in the memory cell region by a dual damascene process in which vias 149 and trenches 150 are formed in insulating layer 148, a metal such as tungsten is deposited on insulating layer 148 and in the vias and the trenches, and the deposited metal is planarized so as to be substantially level with the upper surface of insulating layer 148 (see FIG. 4B). Similarly, in the support circuit region, damascene and/or dual damascene processes may be utilized to form contacts 160, 161 to gates and diffusion regions and to form wiring 162. A second interlayer insulating film 152 of, for example, P-TEOS, is formed on first interlayer insulating film 148. A metallization layer is formed on the second interlayer insulating film 152 and is patterned to form wirings 156. As shown in FIG. 4A, in the support circuit region, a contact 164 formed in an opening 163 in second interlayer insulating film 152 connects one of the wirings 156 to wiring 162.

Figure 5A:
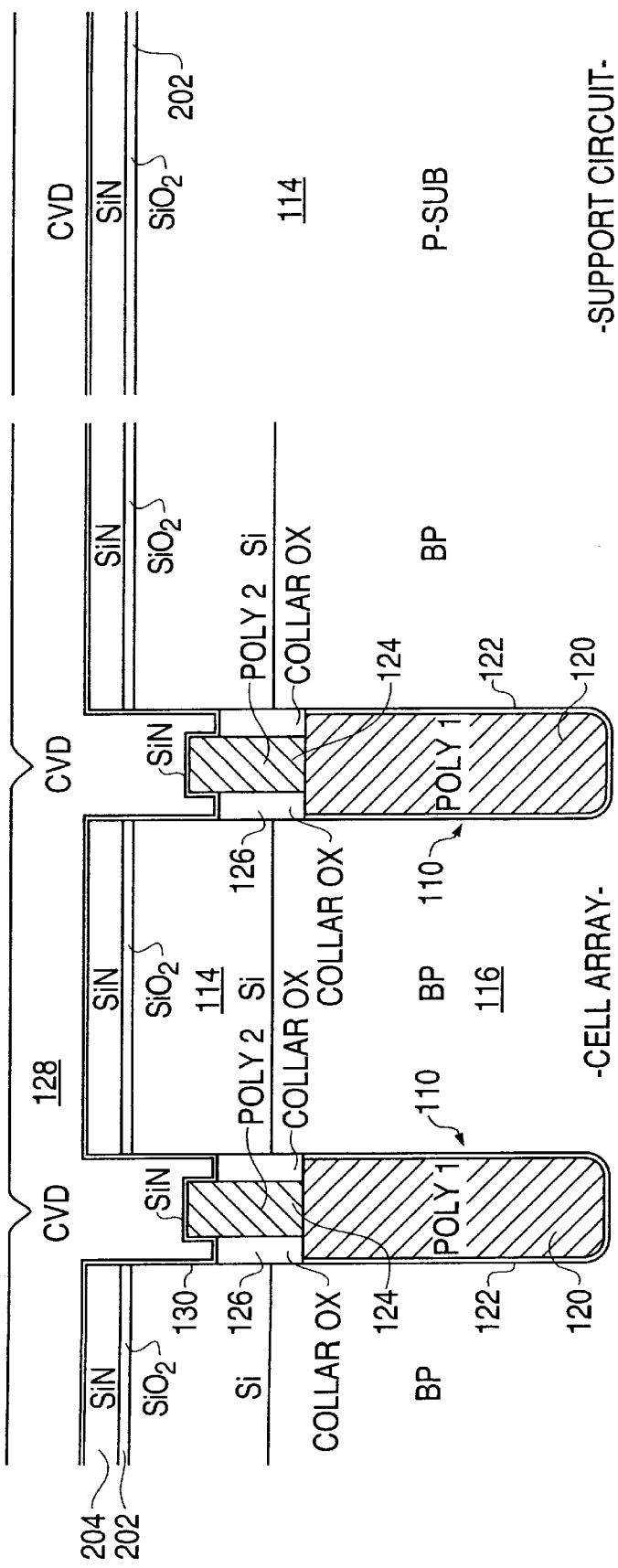

A method for manufacturing the above-described semiconductor memory device will be described with reference to FIGS. 5A–5J. Turning to FIG. 5A, the surface of a P-type silicon substrate 114 is thermally oxidized to form a first pad oxide layer 202 of silicon dioxide (SiO$_2$) having a thickness of about 10 nanometers. The thermal oxidation is performed at about 900° C. in an atmosphere of dry O$_2$. Substrate 114 may be a silicon wafer or an epitaxial layer formed on a silicon wafer. A pad silicon nitride (Si$_3$N$_4$) layer 204 having a thickness of about 100 nanometers is then formed on pad oxide layer 202 by, for example, chemical vapor deposition (CVD). A second pad oxide layer (not shown in FIG. 5A) having a thickness of approximately 400 nanometers is then formed by the evaporation of TEOS (Si(OC$_2$H$_5$)$_4$). Deep trenches 110 each having a depth of approximately 4.9 micrometers, a width (in the bit line direction) of approximately 0.20 micrometers, and a length (in the word line direction) of approximately 0.60 micrometers are formed in silicon substrate 114 in the memory cell region using a patterned resist (not shown) and an etching process such as reactive ion etching (RIE). Deep trenches 110 have an aspect ratio (width/depth) of 25. An N-type diffusion region 116 is then formed in substrate 114 in the memory cell region by implanting impurities and AsG diffusion. The implant may be performed using a dose of $1\times10^{13}$ cm$^{-2}$ of phosphorus and an acceleration voltage of 1.5 MeV. The ASG diffusion may be performed by the deposition of an ASG layer and an ASG layer recess process down to a level which is deeper by the diffusion length than the intended top of region 116, followed by annealing at about 1050° C. for 30 minutes to form diffusion region 116. The buried N-type well may be formed by other methods, e.g., P-well implantation into an N-type semiconductor substrate or by epitaxy, and the invention is not limited in this respect.

An insulating layer 122 such as a nitride-oxide (NO) layer or an oxide-nitride layer is then formed on the entire surface. For example, insulating layer 122 may include a silicon nitride (Si$_3$N$_4$) layer of about 6 nanometers deposited using a low pressure chemical vapor deposition method and a silicon dioxide (SiO$_2$) layer of about 2 nanometers formed by oxidation of the silicon nitride layer at 900° C. in an atmosphere of wet O$_2$. The target thickness of the insulating layer 122 ($^T$effective) is about 4–5 nm silicon dioxide equivalent. After insulating layer 122 is formed, first conductive regions are formed by filling deep trenches 110 with an impurity-doped first conductive material such as N$^+$-type polycrystalline silicon. The doping concentration of the first conductive material is greater than $3\times10^{17}$ cm$^{-3}$. The filling step may be carried out using chemical vapor deposition of silane or disilane, for example. The N$^+$-type polycrystalline silicon is then etched back to a first level within deep trenches 110 using an isotropic etch process such as reactive ion etching to form first trench fills 120. Specifically, the N$^+$-type polycrystalline silicon is etched back to a level which is about 1 micrometer ($\mu$m) below the surface of the semiconductor substrate. The second pad oxide layer is removed before the etch-back of the first fill in the deep trench and after a blanket etch back of the deposited polycrystalline silicon to the top surface of the second pad oxide layer by RIE. Insulating layer 122 is then etched by wet etching to remain at the lower portion of the trench so as to form a storage node insulating layer which insulates the first trench fill from the semiconductor substrate. A collar oxide film 126 is then formed on the sidewalls of the portions of deep trenches 110 opened by the etching back of the N$^+$-type polycrystalline silicon using low pressure chemical vapor deposition (LPCVD) or plasma-enhanced chemical vapor deposition (PECVD) TEOS over the entire surface followed by an etch back using reactive ion etching.

Second conductive regions are then formed by filling in the remainder of deep trenches 110 with a second conductive material. The second conductive material may be, for example, N$^+$-type polycrystalline silicon or undoped polycrystalline silicon and may be formed by chemical vapor deposition (CVD). The second conductive material is etched back by reactive ion etching or some other chemical dry etching process to a level which is about 0.1 micrometer ($\mu$m) below the surface of the semiconductor substrate. The collar oxide 126 is etched by a wet etch and remains as shown in FIG. 5A. Next, a very thin oxide layer having a thickness of approximately 5 nanometers and a silicon nitride (Si$_3$N$_4$) layer having a thickness of approximately 5 nanometers are formed on the upper surface of pad silicon nitride layer 204, on the sidewalls of deep trenches 110, and on the exposed portions of collar oxide film 126 and second trench fill 124. The thin oxide layer is formed, for example, by a rapid thermal oxidation at 1050° C. and the silicon nitride layer is formed, for example, by CVD. For purposes of clarity, the thin oxide layer and the silicon nitride layer are shown as a single liner layer 130 in FIG. 5A. A TEOS layer 128 is then formed by LPCVD, for example, on the upper surface of layer 130 and to fill in deep trenches 110 as shown in FIG. 5A.

Figure 5B:
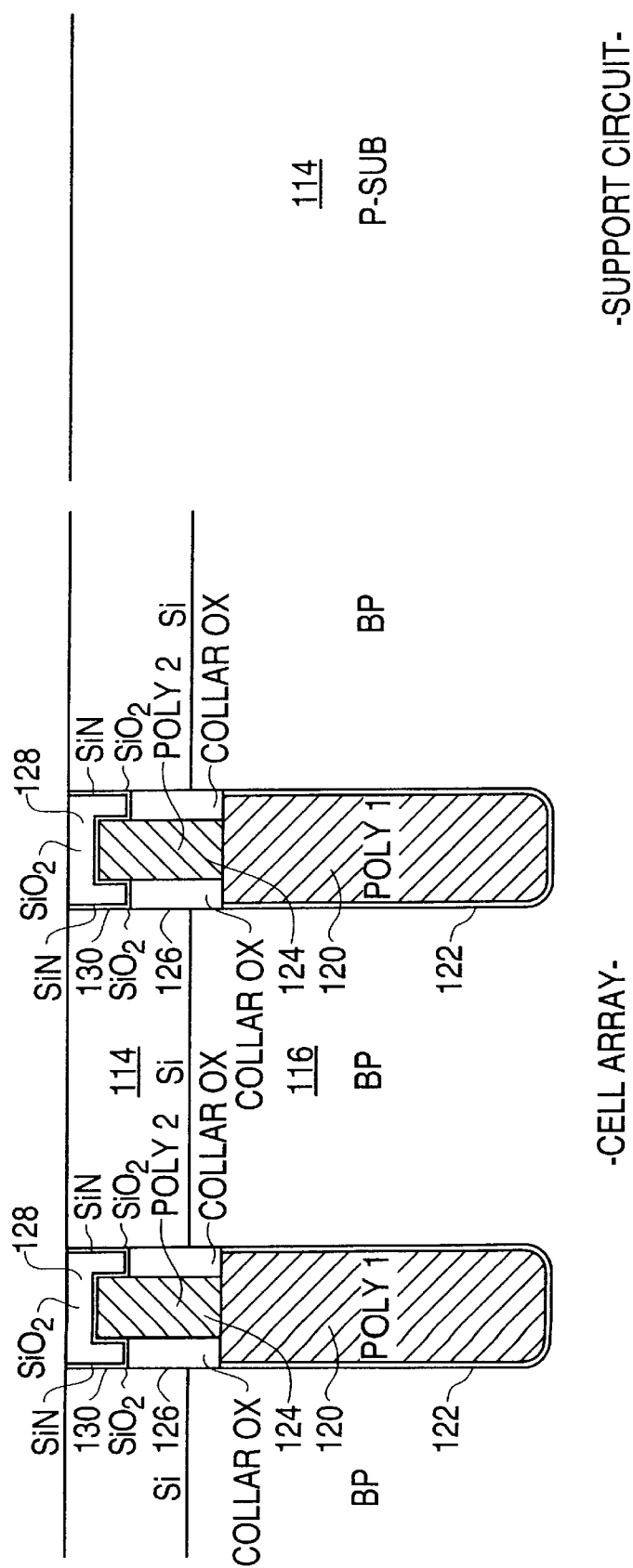

TEOS layer 128 is then recessed by chemical mechanical polishing and RIE to be substantially level with the surface of substrate 114. Liner layer 130 is then removed from the upper surface and the sidewall of pad silicon nitride layer 204 and from the sidewall of pad oxide layer 202, and pad silicon nitride layer 204 and pad oxide layer 202 are removed from the surface of the substrate as shown in FIG. 5B. The silicon nitride is etched, for example, by H$_3$PO$_4$ and the silicon oxide is etched, for example, by an HF solution.

An epitaxial silicon layer 208 having a thickness of about 0.2 micrometers ($\mu$m) is then grown by a solid phase epitaxial growth method on the surface of semiconductor substrate 114 in the memory cell region and in the support circuit region as shown in FIG. 5C. The portion of the epitaxial layer 208 above silicon substrate 114 in the memory cell region, on which the transfer transistor will be formed as described below, is high-quality single crystal silicon. The portion of the epitaxial layer 208 above the trench structures in the memory cell region is formed by horizontal epitaxial growth and thus may have twin boundaries. However, as will become evident, this portion of the epitaxial layer will be removed during the steps for forming the storage node contacts 112.

Figure 5D:
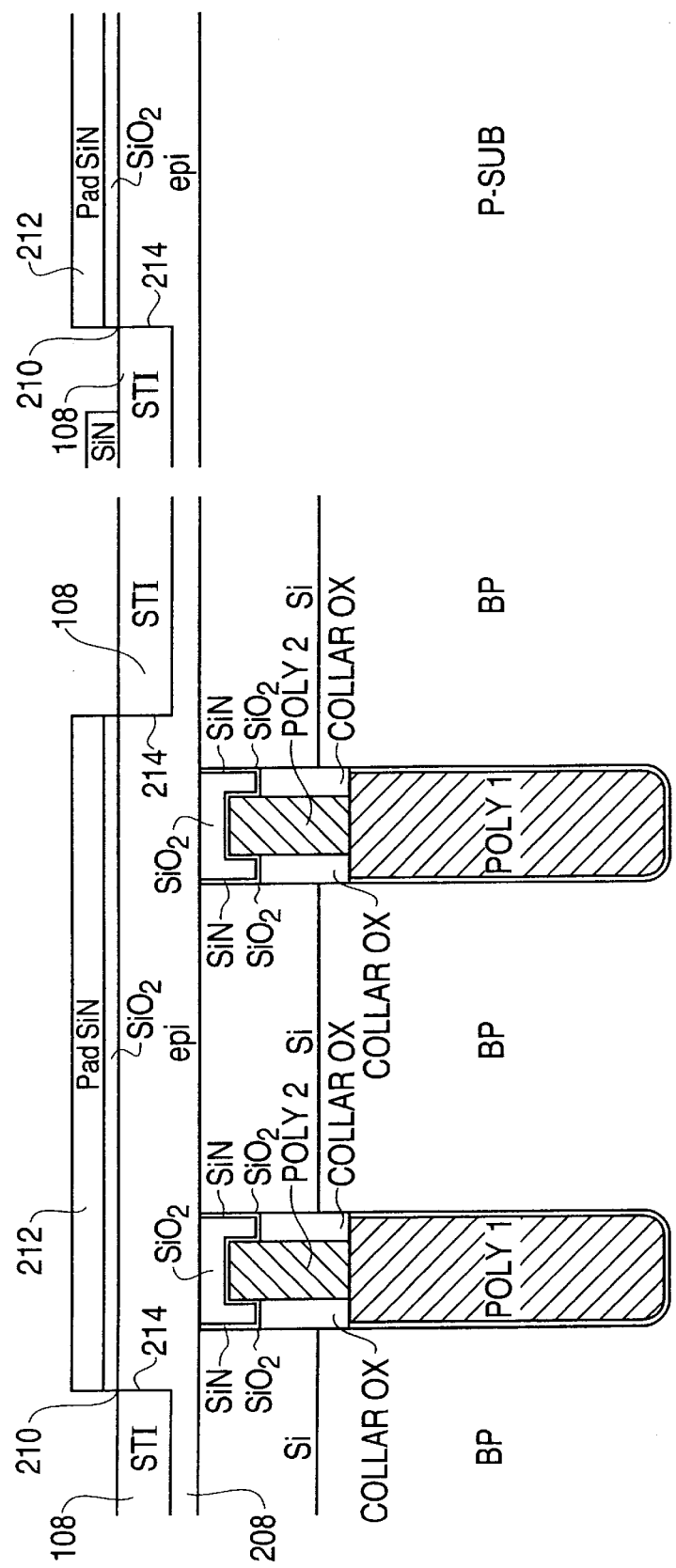

With reference to FIG. 5D, a pad oxide layer 210 of silicon dioxide ($SiO_2$) and a pad nitride layer 212 of silicon nitride ($Si_3N_4$) are successively formed on the surface of epitaxial silicon layer 208. Pad oxide layer 210 may be formed by thermal oxidization (e.g., 900° C. in an atmosphere of dry $O_2$) and may have a thickness of about 10 nanometers. Pad nitride layer 212 may be formed by chemical vapor deposition and may have a thickness of about 100 nanometers. Shallow trenches 214 are then formed in epitaxial layer 208 using a patterned resist (not shown) and an etching process such as reactive ion etching (RIE). The dimensions of the shallow trenches are dependent upon feature size. For example, for a 1 Gbit DRAM, shallow trenches 214 may have a width of 0.15 micrometers ($\mu$m) and a depth of 0.15 micrometers ($\mu$m). An insulating layer of, for example, TEOS, is then blanket deposited over the surface of pad nitride layer 212 and in shallow trenches 214. The insulating layer is then etched back using, for example, CMP and RIE, with pad nitride layer 212 serving as a stopper layer, whereby shallow trench isolation structures 108 which define the active areas AA are formed.

With reference to FIG. 5E, pad nitride layer 212 and pad oxide layer 210 are removed and a sacrificial oxide (not shown) having a thickness of about 6 nanometers (nm) is then formed by furnace oxidation or rapid thermal oxidation (RTO) on the surface of epitaxial layer 208. P-type well region 118 is formed by implanting P-type impurities into the entire surface of the substrate. For example, boron is implanted at a dose of about $1\times10^{13}$ $cm^{-2}$ and acceleration voltages of 10 keV to 300 keV (a retrograde P-well is formed by several acceleration voltages). If desired, a step of implanting impurities into portions of the substrate which will constitute the channel regions of the transfer transistors in the memory cell region and other transistors in the support circuit region may be performed. This implanting of impurities into the channel regions permits a tailoring of the threshold voltage of the transistors. The sacrificial oxide layer is then removed and a gate insulating layer 138 is formed on the surface of the substrate. Gate insulating layer 138 has a thickness of about 6 nanometers (nm) and may be formed by thermal oxidation at a temperature of approximately 850° C. Alternatively, gate insulating layer 138 may be formed by chemical vapor deposition (CVD) and the invention is not limited in this respect. Gate electrodes 136 for the transfer transistors in the memory cell region and for transistors in the support circuit region are then formed by depositing a polysilicon layer which is doped with $N^+$-type impurities, followed by a layer of metal silicide such as tungsten silicide (WSi). After the WSi deposition, a cap silicon nitride layer (not shown) having a thickness of about 15 nanometers (nm) is formed on the WSi layer. The cap silicon nitride layer is provided so that a self-aligned contact may be formed while maintaining isolation between the gate electrodes 136 and bit line contacts 106 and storage node contacts 112. Then, using a patterned photoresist (not shown) and an etching process such as RIE, the cap silicon nitride layer, the silicide layer and the polysilicon layer are etched to form gate electrodes (word lines) 136 in the memory cell region and gate electrodes 136 in the support circuit region. Next, N-type impurities such as phosphorus or arsenic are ion-implanted using gate electrodes 136 as a mask to form N-type source regions 132 and drain regions 134 for the transfer transistors in the memory cell region and to form N-type source and drain regions for the N-channel transistors in the support circuit region. To form P-type source and drain regions for P-channel transistors in the support circuit region, $BF_2$ or B is implanted. Then, a barrier layer 140 of, for example, silicon nitride ($Si_3N_4$) having a thickness of approximately 30 nanometers (nm) is deposited by CVD. Next, an insulating layer 142 of BPSG, for example, is deposited on barrier layer 140. Insulating layer 142 is planarized by chemical mechanical polishing using barrier layer 140 as a stopper layer, resulting in the structure shown in FIG. 5E.

Figure 5F:
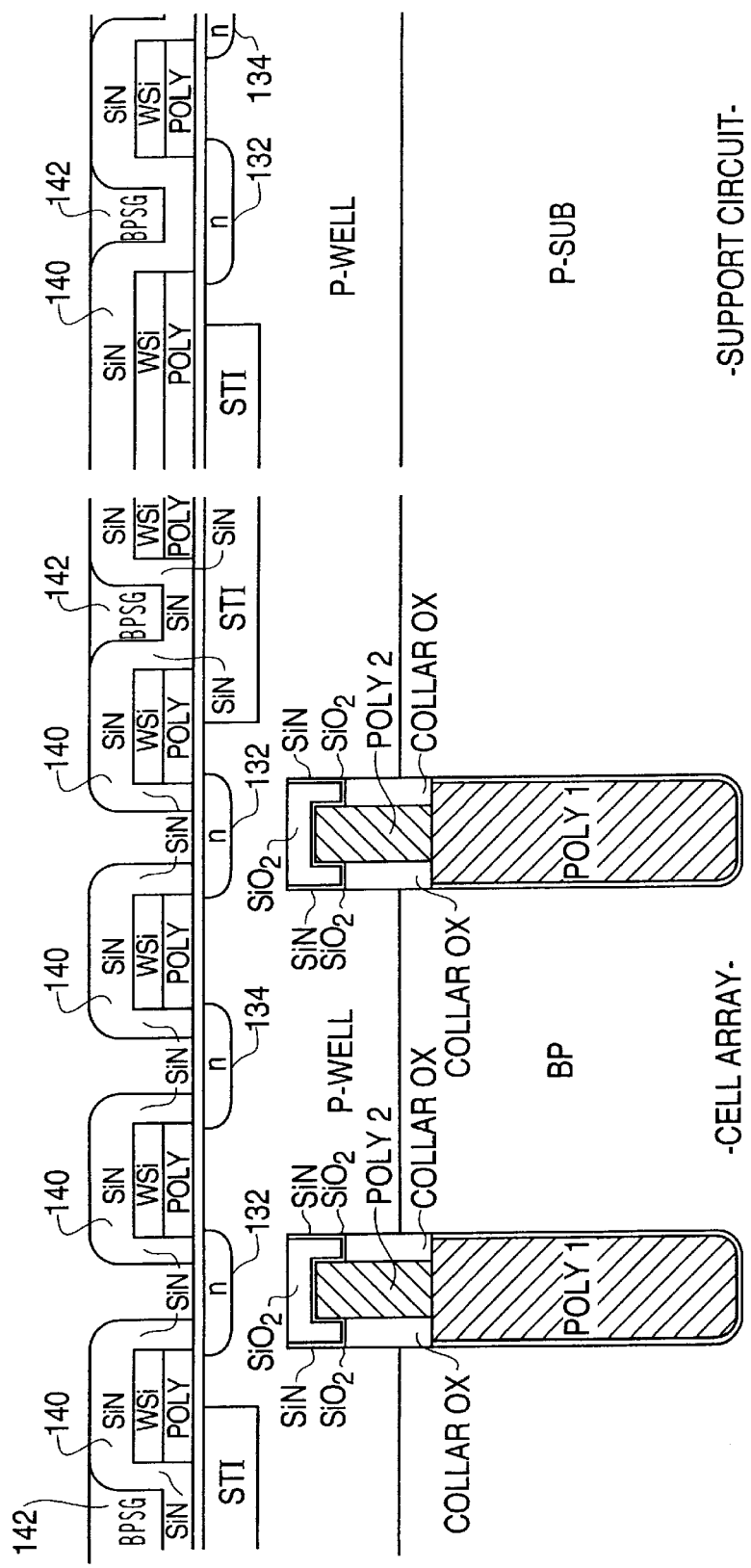

With reference to FIG. 5F, a photoresist (not shown) is deposited. The photoresist is patterned and is used as a mask for selectively etching the portions of insulating layer 142 and barrier layer 140 above source regions 132 and drain regions 134 in the memory cell region. Specifically, using the photoresist as a mask, a selective etch is used to etch insulating layer 142, and then barrier silicon nitride layer 140 is etched by a silicon nitride etching process to open contact regions.

Figure 5G:
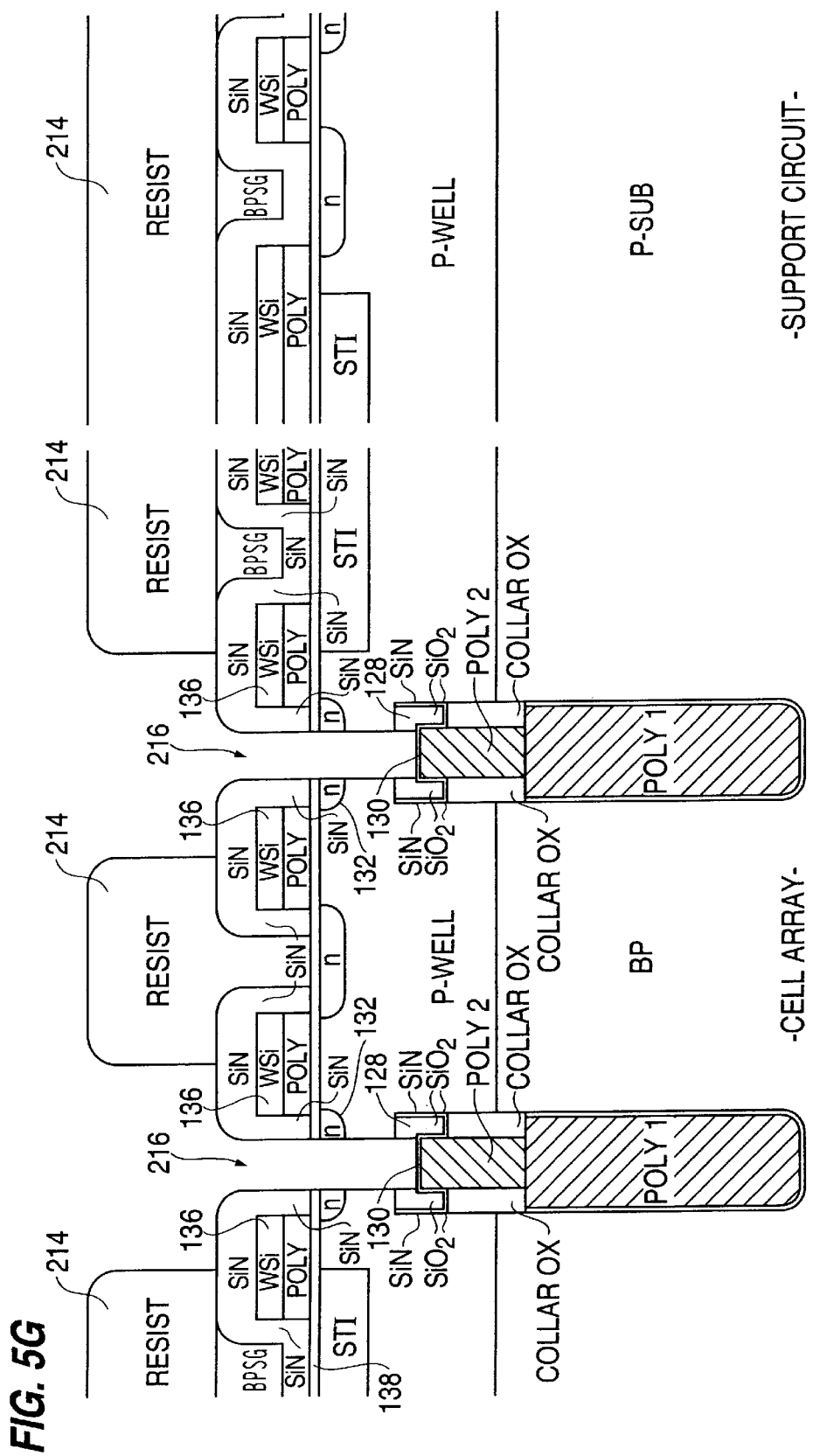

With reference to FIG. 5G, a patterned photoresist 214 is formed for providing contacts to the storage nodes in deep trenches 110 in the memory cell region. Gate insulating layer 138, the silicon substrate, and TEOS layer 128 are etched by an etching process such as reactive ion etching using the patterned photoresist 214 and the gate electrodes 136, with the barrier layer 140 on the top and sidewalls thereof, as a mask to form storage node contact openings 216. The silicon nitride layer which is part of liner layer 130 is then etched. Since gate electrodes 136 are part of the etching mask, the etching process is a self-aligned etching process. Specifically, gate insulating layer 138 is etched by RIE (or by wet etching); the silicon substrate is etched by RIE; and TEOS layer 128 is etched by RIE. The etching of the silicon nitride which is part of liner 130 is accomplished by using wet etching (e.g. $H_3PO_4$) or dry etching.

Figure 5H:
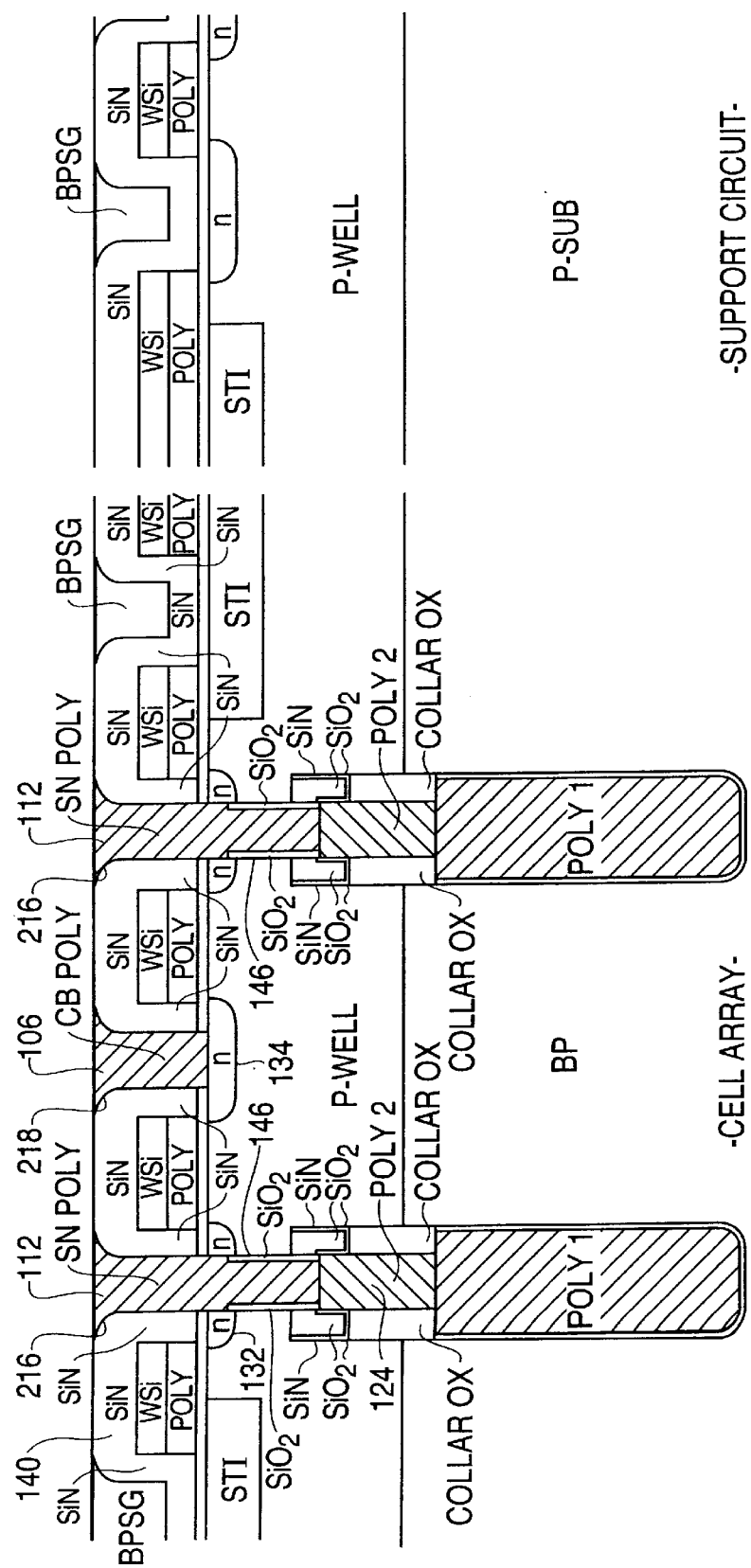

With reference to FIG. 5H, the patterned photoresist 214 is removed and the gate insulating film 138 above drain region 134 is etched to form contact openings 218. An insulating layer 146 of, for example, silicon dioxide having a thickness of about 10 nanometers is deposited over the entire surface and then etched using RIE to expose second trench fill 124. Any remaining portion of the oxide layer of liner 130 on the surface of second trench fill 124 is also etched at this time. Next, a photoresist (not shown) is deposited and recessed to a predetermined depth within storage node contact openings 216. Using the recessed resist as a mask, the unmasked portions of insulating layer 146 are removed by, for example, wet etching so that the upper portion of insulating layer 146 is about 50 nanometers (nm) below the surface of the semiconductor substrate. The recessed resist is then removed and an in-situ phosphorus-doped polysilicon layer is deposited by, for example, chemical vapor deposition, to fill in storage node contact openings 216 and bit line contact openings 218, thereby forming storage node contacts 112 and bit line contacts 106. It will be apparent that insulating layer 146 must be etched-back to a level which permits connection between storage node contact 112 and source region 132, but no connection between storage node contact 112 and P-well 118. The bit line contacts 106 and storage node contacts 112 are then planarized by chemical mechanical polishing to be substantially level with the upper surface of barrier layer 140 as shown in FIG. 5H.

Figure 5I:
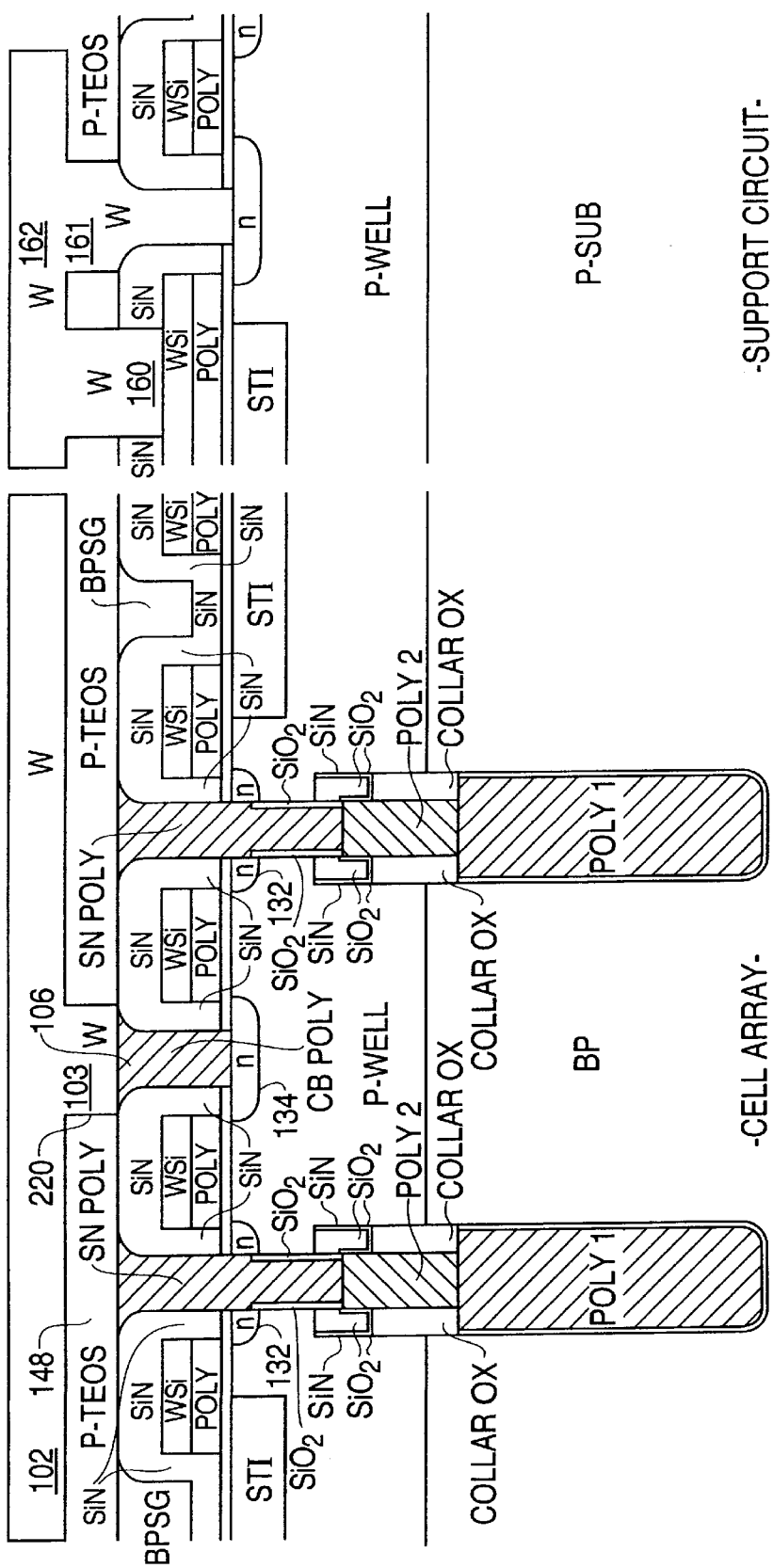
Figure 5J:
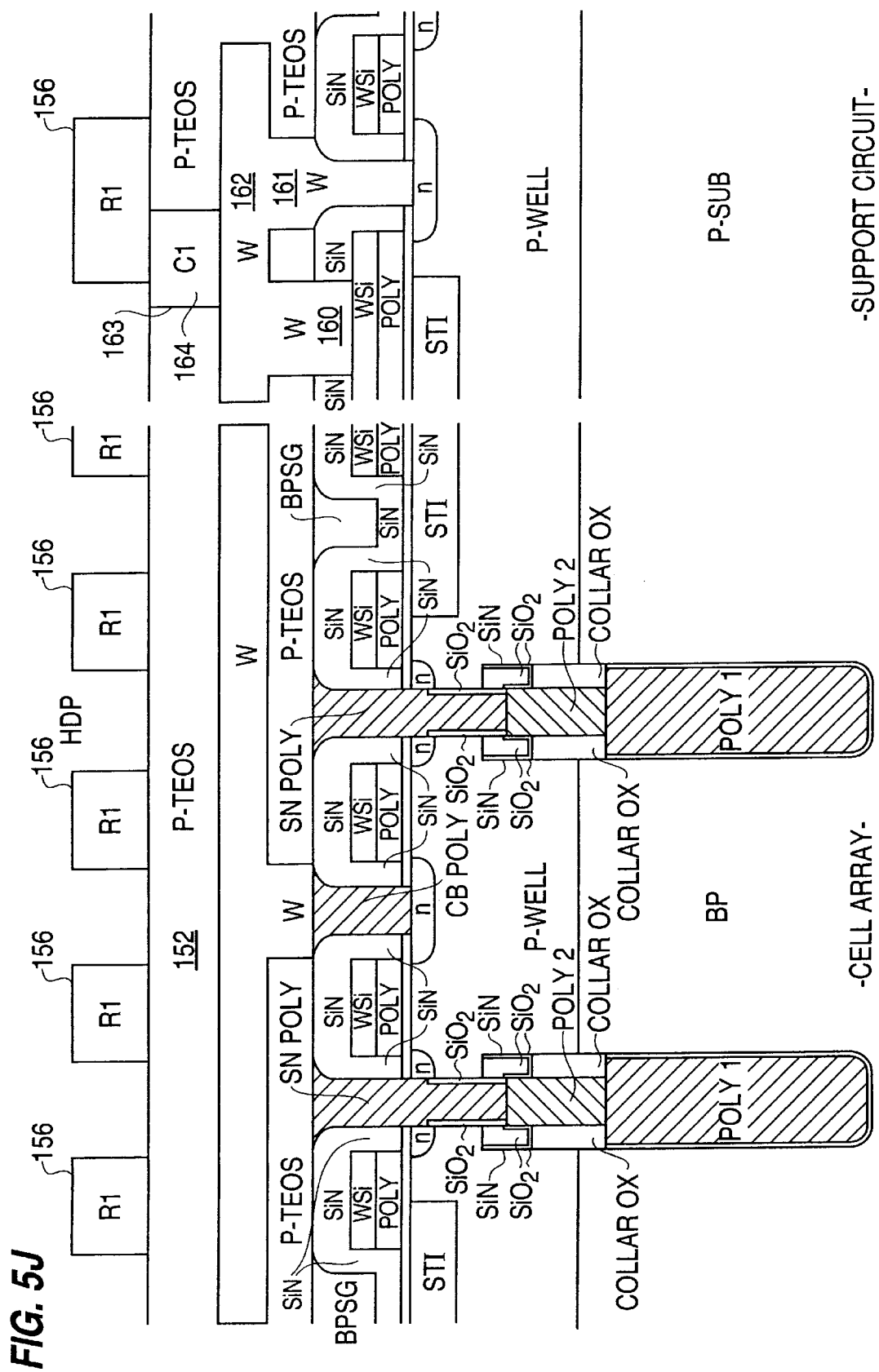

With reference to FIG. 5I, a first interlayer insulating film 148 of, for example, P-TEOS is then deposited. Bit lines 102 and contacts 103 to bit line contacts 106 in the memory cell region and wiring 162 and contacts 160 and 161 to the transistors and diffusion regions in the support circuit region may be formed by a so-called dual damascene process. A "damascene" process refers to a process in which a trench or via is formed and then filled in with a conducting material, followed by planarization. A dual damascene process involves the simultaneous fabrication of a conductive via and a conductive wiring. Such a process reduces the number of process steps and eliminates an interface between the conductive via and the conductive wiring. In the present method, vias and trenches for the contacts 103 and bit lines 102 in the memory cell region are formed in P-TEOS layer 148 by conventional photolithography and RIE processing. Vias and trenches are similarly formed for the contacts 160, 161 and wiring 162 in the support circuit region. Then, tungsten is deposited by CVD. The tungsten is then planarized by chemical mechanical polishing down to the top of the P-TEOS layer 148, i.e., P-TEOS layer 148 acts as a stopper layer for the CMP process. An adhesion/barrier layer such as titanium nitride may be formed, for example, by sputtering prior to the deposition of the tungsten. A second interlayer insulating film 152 of, for example, P-TEOS is then deposited and an opening 163 is formed therein to expose wiring 162 in the support circuit region. A contact 164 to wiring 162 is formed in opening 163 using a damascene process in which opening 163 is formed by conventional lithography and etching processing, followed by the deposition and planarization of a conductive material such as tungsten. A conductive layer is then deposited and patterned to form wirings 156 as shown in FIG. 5J.

Figure 1A:
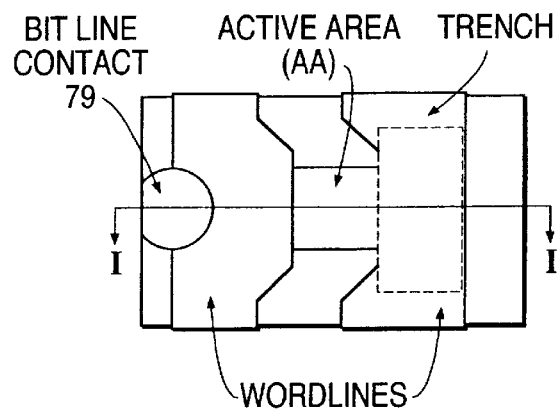
FIGS. 1A and 1B are a cross-sectional view and a top-down view, respectively, of a dynamic random access memory cell having a MINT architecture.
Figure 1B:
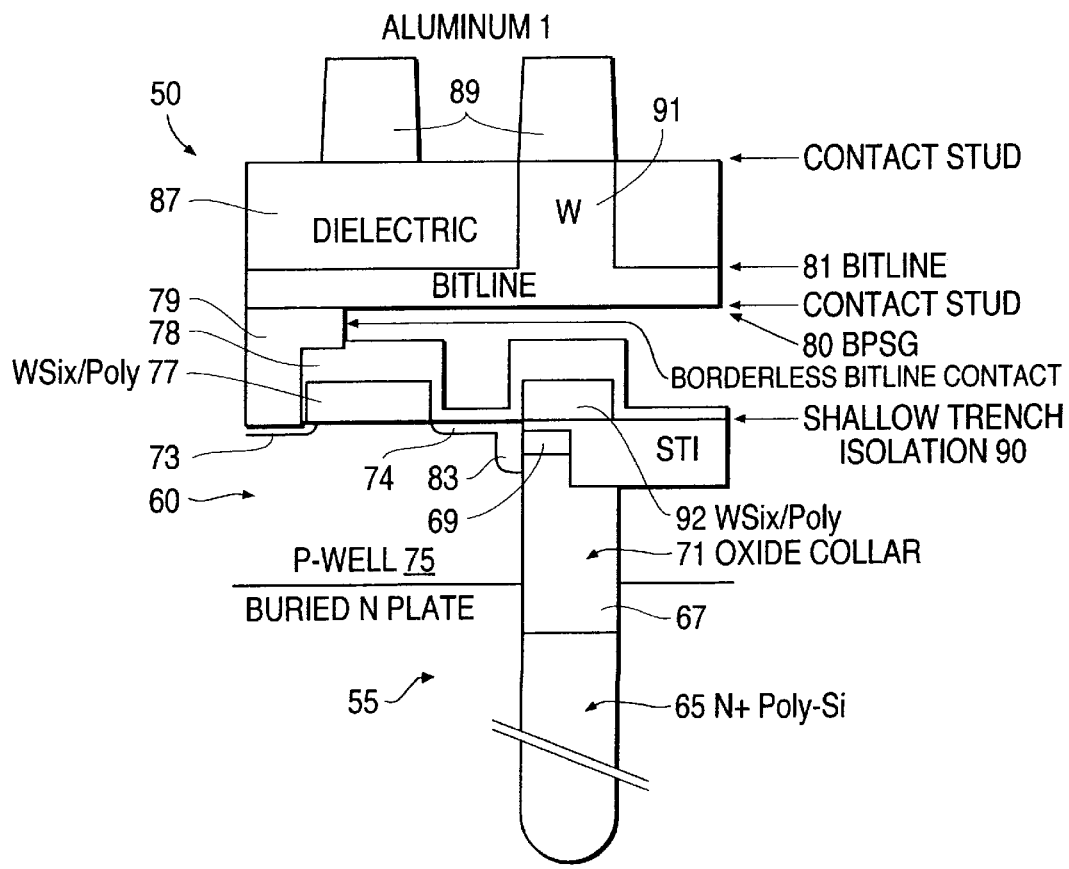
Figure 2A:
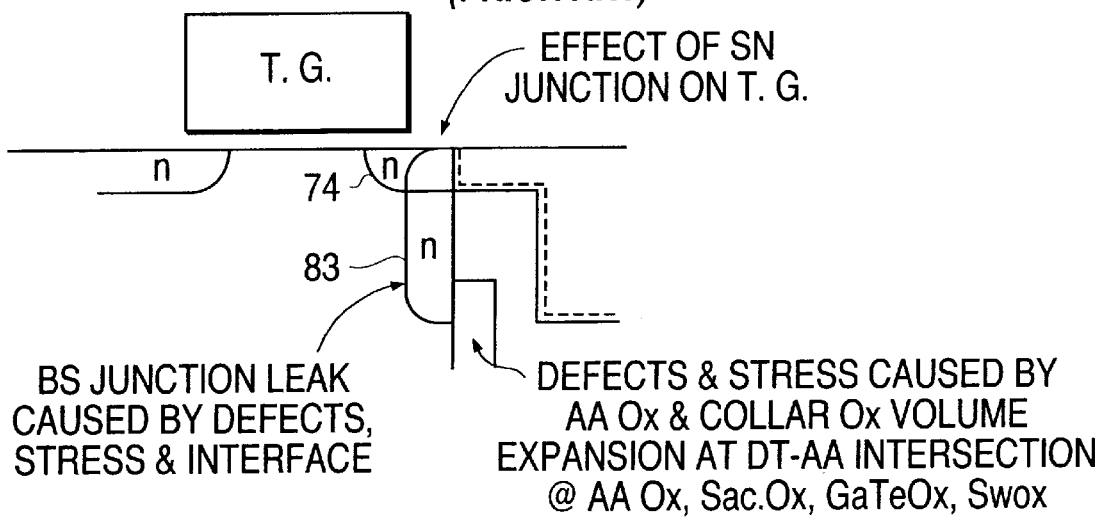
FIGS. 2A and 2B are used to illustrate various problems associated with the memory cell structure shown in FIGS. 1A and 1B.
Figure 2B:
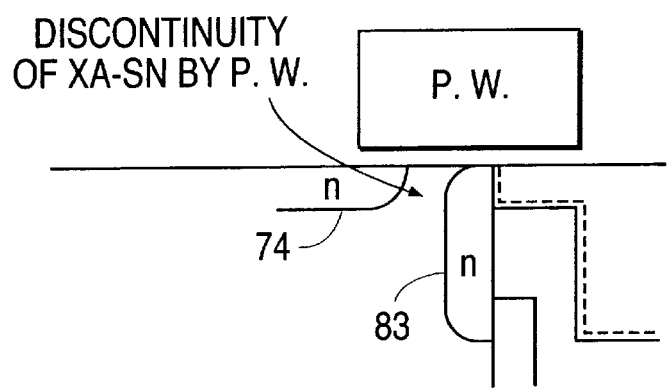

The memory device shown in FIGS. 3, 4A, and 4B and manufactured in accordance with the method explained with reference to FIGS. 5A–5J includes highly integrated memory cells having capacitors for storing a charge which is sufficient to ensure that data may be correctly written to and read out from the memory cell. This memory cell has a compact cell size of $8F^2$, where F is a feature size and the cell size is $2F \times 4F$. In addition, the memory cell overcomes many of the disadvantages associated with the MINT architecture. For example, as can be seen with reference to FIGS. 5G and 5H, the steps for forming the storage node contact (strap) do not affect the transfer transistor. In addition, there is no discontinuity of the cell array junction to the strap junction caused by ion implantation shadowing due to a passing word line. Still further, there is no volume expansion of the active area oxide and the collar oxide at the deep trench-active area intersection. This serves to reduce the incidence of defects and stress. Yet further, there is no deep trench-shallow trench isolation intersection. Thus, the process for forming the shallow trench isolation structures does not adversely affect the deep trench capacitor. The process provides for long and high temperature stress relief anneal when the gate conductors are formed since the strap is formed after the gate conductor process. In addition, the transfer transistor is formed on a high-quality silicon layer and therefore possesses good operating characteristics. Specifically, with reference to FIG. 5G, it can be seen that the storage node contact is formed by etching the epitaxial silicon above the deep trenches and that the transfer transistor is formed in the high-quality epitaxial silicon formed above the substrate 114. Thus, the memory device of the present invention offers the possibility of being applied to 1 GBit DRAMs and beyond. Still further, the trench capacitor and the transfer transistor are connected using a self-aligned process. Specifically, the gate electrode functions as part of a mask for the etching process for forming the opening for the connecting strap. By using such a self-aligned process, misalignment errors can be avoided and the strap between trench capacitor and the transfer transistor can be accurately formed. In addition, as can be seen with reference to Tables 1 & 2 below, a large deep trench having horizontal dimensions of approximately $3F \times F = 3F^2$ is available, resulting in a shallower deep trench depth than the MINT cell of FIGS. 1A and 1B. This simplifies the deep trench processing and reduces manufacturing costs. Still further, a well-controlled shallow trench isolation process is realized since the STI depth is shallower than in the MINT cell and can be more easily filled, active area patterning is easier than in a MINT cell, and STI height control is better than in a MINT cell due to enhanced uniformity of the pad silicon nitride since the pad silicon nitride is not affected by the deep trench processes in the invention.

Figure 6:
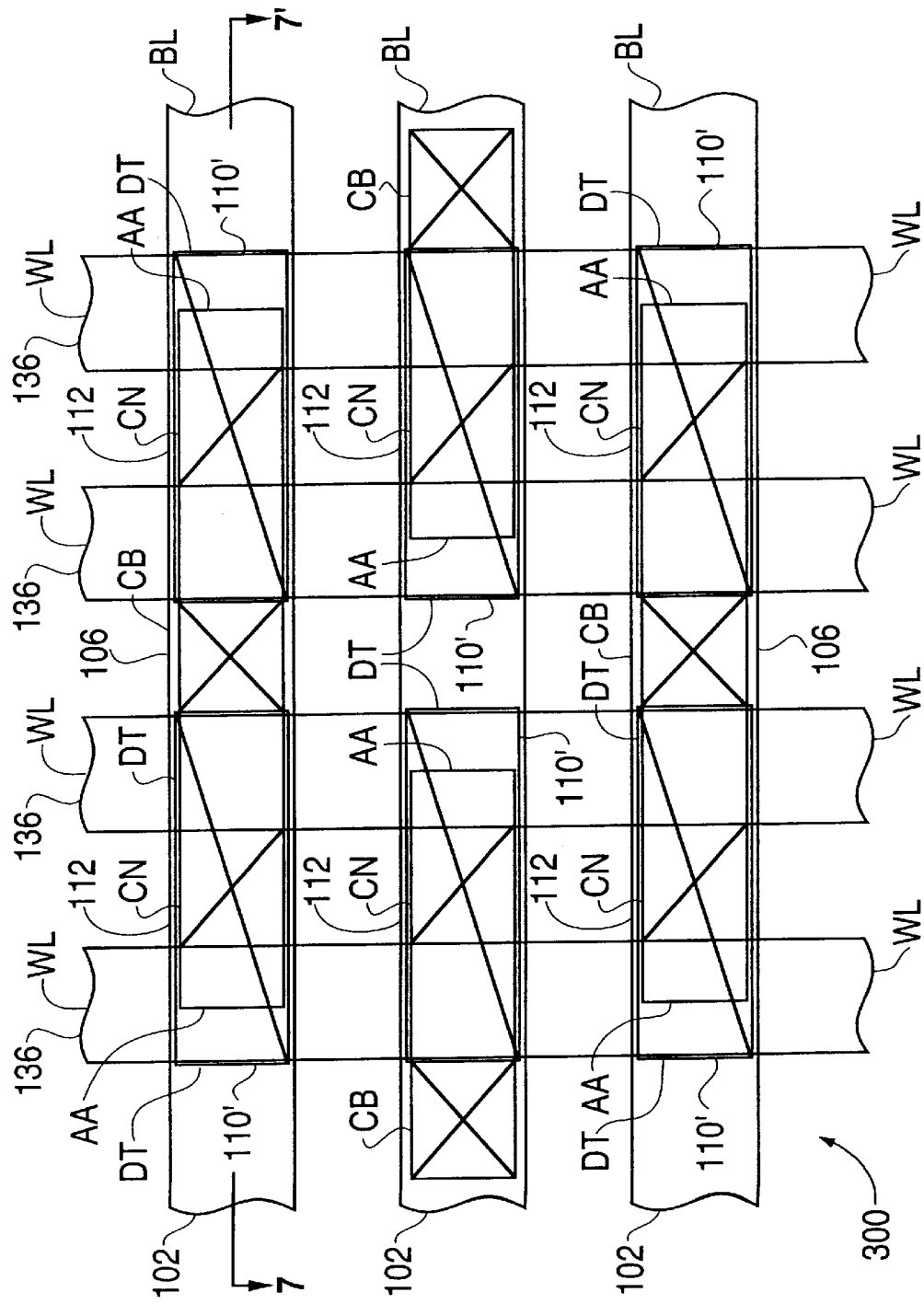
FIG. 6 is a top-down view of a semiconductor memory device in accordance with a second embodiment of the present invention.
Figure 7:
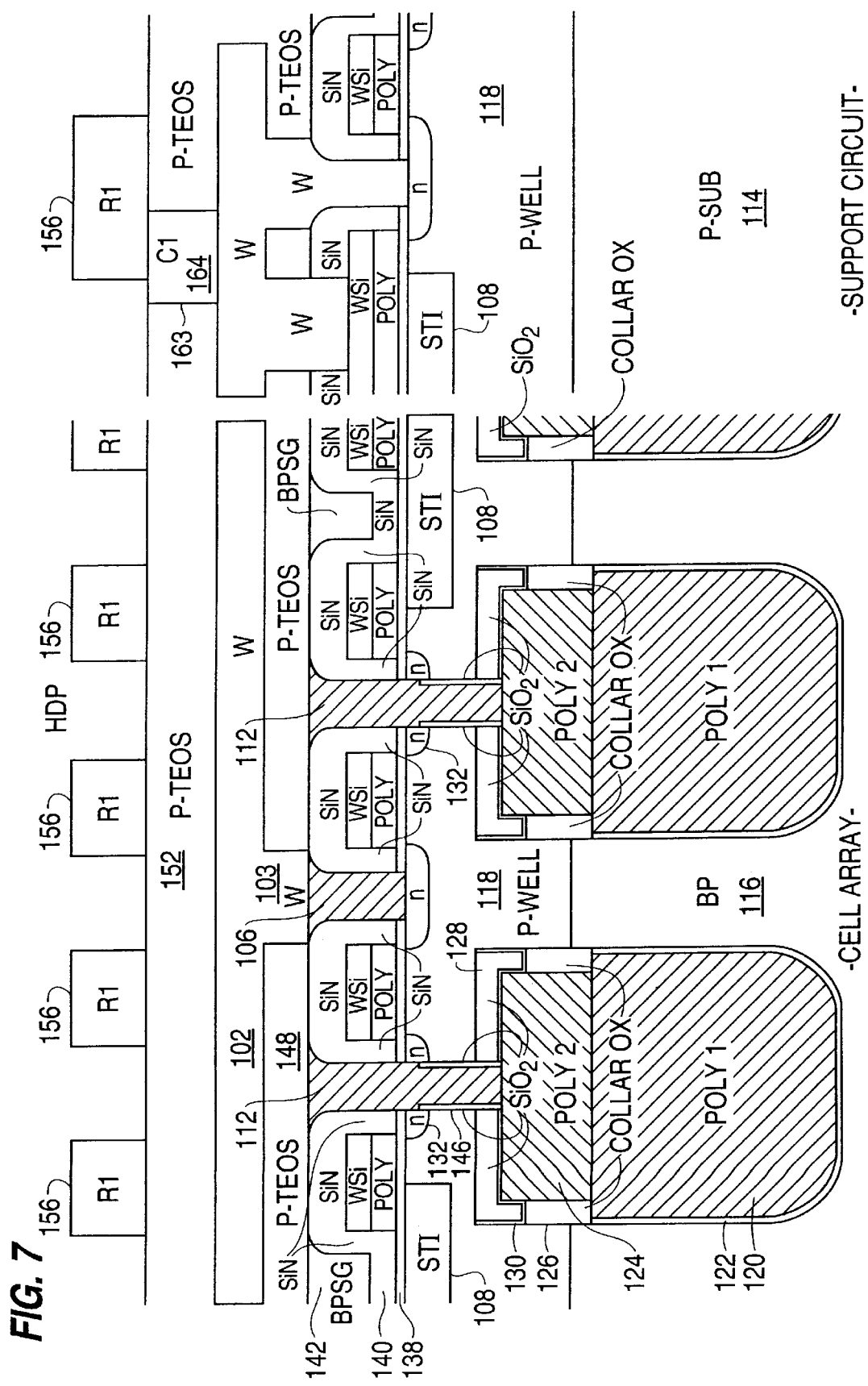
FIG. 7 is a cross-sectional view taken along line 7–7' of FIG. 6.

FIG. 6 is a top-down view of a memory device in accordance with a second embodiment of the present invention. FIG. 7 is a cross-sectional view taken along line 7–7' of FIG. 6. The portions of the memory device of FIGS. 6 and 7 which are the same as in the first embodiment are denoted by the same reference numbers. With reference to FIG. 6, memory device 300 includes bit lines 102 formed to extend in a first direction (i.e., horizontally in FIG. 6) and word lines 136 formed to extend in a second direction (i.e., vertically in FIG. 6). Bit line contacts 106 are arranged at a one-half pitch. That is, the bit line contacts for every other bit line are vertically aligned. A plurality of active areas AA are defined by shallow trench isolation (STI) structures 108 (see FIG. 7). Active areas AA have a width extending in the word line direction and a length extending in the bit-line direction. The trench capacitors (storage nodes) of the memory cells are formed in deep trenches 110'. Deep trenches 110' have a width extending in the word line direction and a length extending in the bit line direction. Storage node contacts 112 are located between adjacent ones of the word lines and provide an electrical connection between the trench capacitors and the transfer gates.

In the second embodiment, deep trenches 110' are oriented in a direction which is orthogonal to the direction in which the deep trenches 110 are oriented in the first embodiment. Because of this, forming the semiconductor memory device of FIGS. 6 and 7 using the method described with respect to FIGS. 5A–5J will cause the transfer transistors to be formed in the portion of the epitaxial layer over the deep trench. As noted above, this portion of the epitaxial layer may have defects which could adversely affect the operation of the transfer transistors. In order to provide a high quality epitaxial layer in which to form the transfer transistors, the epitaxial layer may be subjected to a high temperature annealing process (e.g., at a temperature of about 1100° C. in an atmosphere of $N_2$). Alternatively, a laser or an electron beam anneal may be used. In still another alternative embodiment, a wafer bonding technique such as that shown in FIG. 8 may be utilized. Specifically, a first silicon wafer 302 having the trench capacitors formed therein is bonded to a second silicon wafer 306 having shallow trench isolation regions 108 formed therein. Second silicon wafer 306 is then polished by, for example, chemical mechanical polishing (CMP) to provide a silicon layer 308 having a thickness of, for example, about 0.15 micrometers (μm) for a 1 Gbit DRAM. The process steps of FIGS. 5E–5J may then be carried out to form the semiconductor memory device of FIGS. 6 and 7. In this way, the problems associated with low quality epitaxial films grown over the deep trenches can be avoided.

Figure 9B:
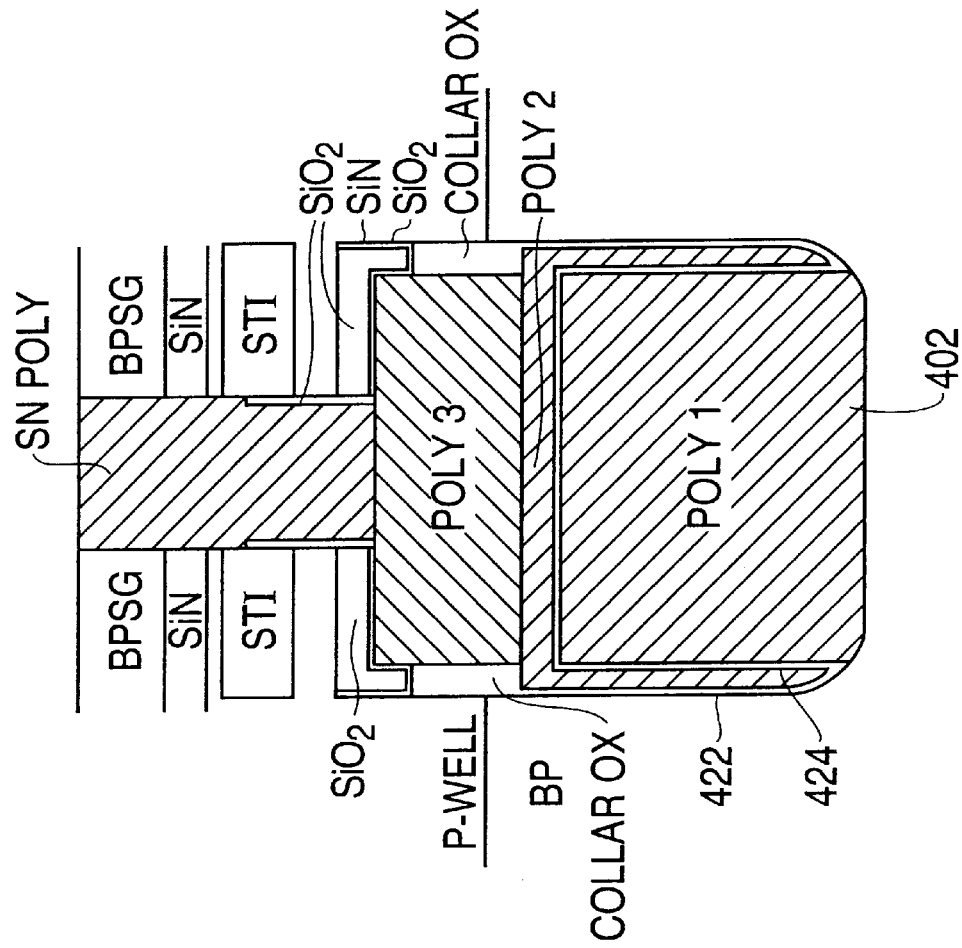
FIGS. 9A and 9B are storage node cross-sections corresponding to the views of FIGS. 4A and 4B for a semiconductor memory device in accordance with a third embodiment of the present invention.
Figure 9A:
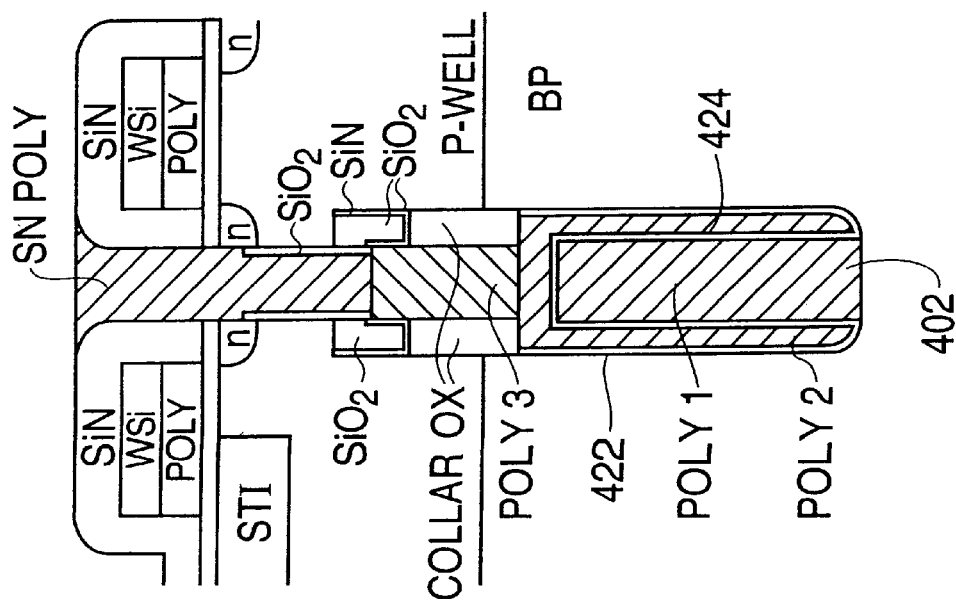

FIG. 9A and 9B show a cross-section of a memory cell in accordance with a third embodiment of the present invention. In the embodiment of FIGS. 9A and 9B, first trench fill 402 has a cylindrical shape. In this way, the depth of the trench in which the capacitor is formed can be decreased. A memory cell of this embodiment can be formed by performing the steps as in the first embodiment for forming the deep trenches. After the deep trench etch, an oxide layer 422 having a thickness, for example, of 50 nanometers (nm) is deposited and etched by reactive ion etching so as to remain on the deep trench sidewall. Then an N± type polycrystalline silicon layer is deposited and etched back to a level which is about 1 micrometer (μm) below the surface of the semiconductor substrate. Then, a node dielectric film 424 is formed. Next, a second polysilicon layer is deposited and etched back to a level which is 0.1 higher than the first polysilicon layer 402. After this, the process is the same as the process for the first embodiment.

TABLE 1

| Cell Type | MINT | First Embodiment/Second Embodiment | Third Embodiment |
|---|---|---|---|
| Design Rule, F | 0.18 μm | 0.18 μm | 0.18 μm |
| Cell Size | 0.36 = 0.72 μm² = 0.2592 μm² | 0.36 × 0.72 μm² = 0.2592 μm² | 0.36 × 0.72 μm² = 0.2592 μm² |
| Trench Size | 0.22 × 0.36 μm² = 0.0792 μm² | 0.20 × 0.60 μm² = 0.12 μm² | 0.20 × 0.60 μm² = 0.12 μm² |
| Cs | 30 fF | 30 fF | 30 fF |
| T$_{ox}$ effective | 4 nm | 4 nm | 4 nm |
| Total Trench Depth | 7.0 μm | 4.9 μm | 3.0 μm |
| Aspect ratio of Trench | 32 | 25 | 15 |

Table 1 provides a cell comparison for the first generation of 1 Gbit DRAM devices having a 0.18 micron design rule. As can be seen from the data set forth in Table 1, DRAM devices manufactured in accordance with the embodiments of the present invention provide the same capacitance as scaled down cells manufactured in accordance with the MINT architecture shown in FIGS. 1A and 1B of this patent application, while at the same time providing trenches with smaller aspect ratios within which the capacitors are formed. Specifically, 1 Gbit memory cells in accordance with the first and second embodiments of the present invention have trench capacitors formed in trenches with aspect ratios which are 28% less than the aspect ratio of the trenches for 1 Gbit memory cells based on scaling down the current MINT architecture. Memory cells in accordance with the third embodiment of the present invention have trench capacitors formed in trenches with aspect ratios which are more than 50% less than the aspect ratios of the trenches for the scaled down MINT architecture. As noted above, the ability to achieve a high capacitance for trench capacitors formed in trenches with small aspect ratios provides for easier manufacturing.

TABLE 2

| Cell Type | MINT | First Embodiment/Second Embodiment | Third Embodiment |
|---|---|---|---|
| Design Rule, F | 0.12 μm | 0.12 μm | 0.12 μm |
| Cell Size | 0.24 × 0.48 μm² = 0.1152 μm² | 0.24 × 0.48 μm² = 0.1152 μm² | 0.24 × 0.48 μm² = 0.1152 μm² |
| Trench Size | 0.15 × 0.26 μm² = 0.039 μm² | 0.14 × 0.38 μm² = 0.0532 μm² | 0.14 × 0.38 μm² = 0.0532 μm² |
| Cs | 25 fF | 25 fF | 25 fF |
| T$_{ox}$ effective | 3 nm | 3 nm | 3 nm |
| Total Trench Depth | 7.4 μm | 5.5 μm | 3.5 μm |
| Aspect ratio of Trench | 49 | 39 | 25 |

Table 2 provides a cell comparison for the first generation of 4 Gbit DRAM devices having a 0.12 micron design rule. As can be seen from the data set forth in Table 2, DRAM devices manufactured in accordance with the embodiments of the present invention provide the same capacitance as scaled-down cells manufactured in accordance with the MINT architecture shown in FIGS. 1A and 1B of this patent application, while at the same time providing trenches with smaller aspect ratios within which the capacitors are formed. Specifically, 4 Gbit memory cells in accordance with the first and second embodiments of the present invention have trench capacitors formed in trenches with aspect ratios which are about 25% less than the aspect ratio of the trenches for 4 Gbit memory cells based on scaling down the current MINT architecture. Memory cells in accordance with the third embodiment of the present invention have trench capacitors formed in trenches with aspect ratios which are almost 50% less than the aspect ratios of the trenches for the scaled-down MINT architecture. As noted above, the ability to achieve a high capacitance for trench capacitors formed in trenches with small aspect ratios provides for easier manufacturing.

While the invention has been described in detail with reference to the appended drawings, the invention is limited in scope only by the claims. Moreover, any patent or publication cited herein should be construed to be incorporated by reference as to any subject matter deemed essential to the present disclosure.

We claim:
1. A semiconductor memory device, comprising:
a semiconductor substrate;
a first semiconductor region of a first conductivity type formed on the semiconductor substrate;
a second semiconductor region of a second conductivity type opposite to the first conductivity type, the second semiconductor region being formed on the first semiconductor region;
a trench capacitor having a trench, the trench passing through the first semiconductor region and the second semiconductor region, an upper portion of the trench capacitor being formed so as not to reach an upper surface of the second semiconductor region, a conductive trench fill being formed in the trench;
a pair of gate electrodes each formed on the second semiconductor region, the pair of gate electrodes being located above the trench capacitor;
a pair of insulating layers each formed so as to surround a corresponding one of the pair of gate electrodes;
a conductive layer formed between the pair of insulating layers so as to be self-aligned thereto, a front-end of the conductive layer extending inside the second semiconductor region, wherein the front-end is insulated from the second semiconductor region and electrically connected to the trench fill of the trench capacitor; and a pair of third semiconductor regions of the first conductivity type disposed on opposing sides of the conductive layer, each of the third semiconductor regions being formed in an upper portion of the second semiconductor region, being in direct contact with the conductive layer, constituting a source or a drain of a transistor having one of the pair of gate electrodes, and having a substantially uniform depth.

2. The semiconductor memory device of claim 1, wherein a surface region of the second semiconductor region comprises an epitaxial layer.

3. The semiconductor memory device of claim 1, wherein a surface region of the second semiconductor region comprises a semiconductor wafer bonded to the first semiconductor region.

4. The semiconductor memory device of claim 1, further comprising a third insulating layer insulating the conductive layer from the second semiconductor region.

5. The semiconductor memory device of claim 1, further comprising an element isolating region disposed in the second semiconductor region, the element isolating region separating the second semiconductor region into a plurality of element regions.

6. The semiconductor memory device of claim 5, wherein the plurality of element regions are arranged in an extending direction of the word line at a one-quarter pitch.

7. The semiconductor memory device of claim 5, wherein the plurality of element regions are arranged in an extending direction of the word line at a one-half pitch.

8. The semiconductor memory device of claim 1, wherein the trench capacitor has a planar surface with a first side and a second side longer than the first side, the first side being parallel to an imaginary line between the pair of third semiconductor regions, the second side being in a direction different from a direction of the imaginary line.

9. The semiconductor memory device of claim 1, wherein the trench capacitor has a planar surface with a first side and a second side longer than the first side, the second side being parallel to an imaginary line between the pair of third semiconductor regions, the first side being in a direction different from a direction of the imaginary line.

* * * * *